(12) United States Patent
Chiang et al.

(10) Patent No.: US 12,035,532 B2
(45) Date of Patent: Jul. 9, 2024

(54) MEMORY ARRAY AND MEMORY DEVICE

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Chao-Ching Cheng, Hsinchu (TW); Tzu-Chiang Chen, Hsinchu (TW); Chih-Chieh Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 672 days.

(21) Appl. No.: 17/149,727

(22) Filed: Jan. 15, 2021

(65) Prior Publication Data

US 2022/0231030 A1 Jul. 21, 2022

(51) Int. Cl.
*H01L 27/1157* (2017.01)
*H01L 29/08* (2006.01)
*H01L 29/165* (2006.01)
*H01L 29/66* (2006.01)
*H01L 29/78* (2006.01)
(Continued)

(52) U.S. Cl.
CPC ......... *H10B 43/35* (2023.02); *H01L 29/0847* (2013.01); *H01L 29/165* (2013.01); *H01L 29/66636* (2013.01); *H01L 29/66795* (2013.01); *H01L 29/66833* (2013.01); *H01L 29/7848* (2013.01); *H01L 29/7851* (2013.01); *H01L 29/792* (2013.01)

(58) Field of Classification Search
CPC ..... H01L 21/823431; H01L 21/823821; H01L 21/845; H01L 27/0886; H01L 27/0924; H01L 27/1211; H01L 29/0847; H01L 29/165; H01L 29/41791; H01L 29/66636; H01L 29/66795; H01L 29/6683; H01L 29/7848; H01L 29/785; H01L 29/7851; H01L 29/7853; H01L 29/7855; H01L 29/792; H01L 2029/7858; H10B 43/35
See application file for complete search history.

(56) References Cited

U.S. PATENT DOCUMENTS

| 8,836,016 | B2 | 9/2014 | Wu et al. |
| 8,841,701 | B2 | 9/2014 | Lin et al. |
| 8,847,293 | B2 | 9/2014 | Lee et al. |

(Continued)

*Primary Examiner* — David C Spalla
(74) *Attorney, Agent, or Firm* — JCIPRNET

(57) ABSTRACT

A memory array and a structure of the memory array are provided. The memory array includes flash transistors, word lines and bit lines. The flash transistors are arranged in columns and rows. The flash transistors in each column are in serial connection with one another. The word lines are respectively coupled to gate terminals of a row of the flash transistors. The bit lines are respectively coupled to opposite ends of a column of the flash transistors. Band-to-band tunneling current at a selected flash transistor is utilized as read current during a read operation. The BTB tunneling current flows from one of the source/drain terminals of the selected flash transistor to the substrate, rather than flowing from one of the source/drain terminals to the other. As a result, charges stored in multiple programming sites of each flash transistor can be respectively sensed.

20 Claims, 40 Drawing Sheets

(51) Int. Cl.
*H01L 29/792* (2006.01)
*H10B 43/35* (2023.01)

(56) References Cited

U.S. PATENT DOCUMENTS

| | | | |
|---|---|---|---|
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 9,673,210 B1* | 6/2017 | Thees | H10B 43/40 |
| 2008/0123435 A1* | 5/2008 | Liao | H01L 29/792 |
| | | | 257/E21.21 |
| 2013/0100743 A1* | 4/2013 | Lue | H01L 29/792 |
| | | | 365/185.18 |
| 2016/0181269 A1* | 6/2016 | Lai | H10B 63/845 |
| | | | 257/326 |
| 2018/0181679 A1* | 6/2018 | Hong | G06F 16/90339 |
| 2019/0304987 A1* | 10/2019 | Dong | H10B 51/30 |

* cited by examiner

MEMORY ARRAY AND MEMORY DEVICE

BACKGROUND

Non-volatile memory is a type of electronic memory that can retain stored data even after power supply is removed. Given its data retention ability, non-volatile memory covers a wide range of applications from automotive to computer and communication. Since decades ago when flash memory has been invented, flash memory has become a comprehensively used non-volatile memory in digital devices. By ways memory cells in the flash memory are organized, flash memory can be divided into NAND flash and NOR flash. NAND flash has merits including high storage density and fast write/erase speed, and is suited for demands of solid state drive (SSD), flash drive and flash memory card. However, in a conventional NAND flash, only a single bit can be stored in a memory cell, thus pursuing even higher storage density (i.e., lower cost) of NAND flash is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
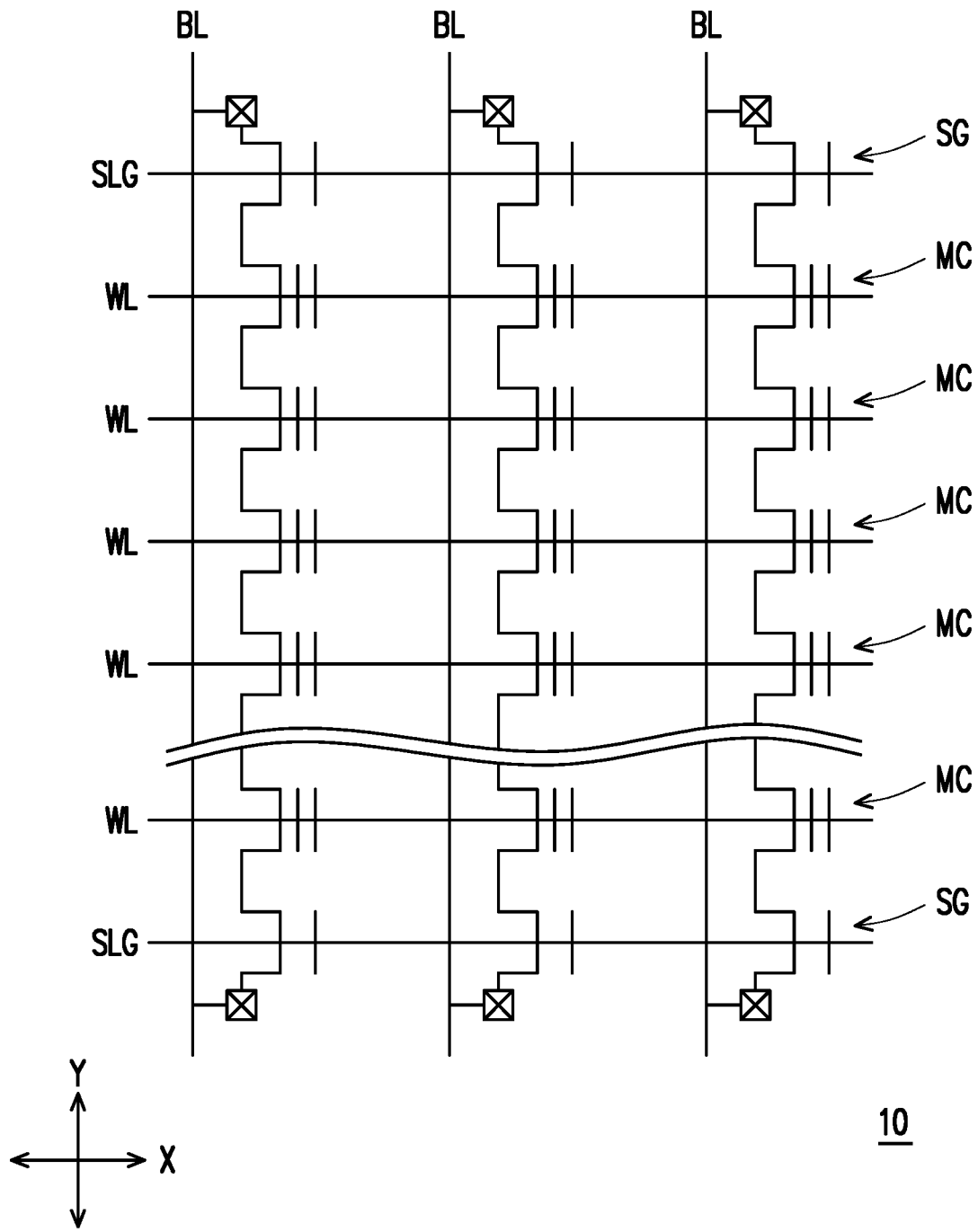
FIG. 1A is a circuit diagram illustrating a memory array according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a circuit diagram illustrating a memory array 10 according to some embodiments of the present disclosure.

Referring to FIG. 1A, the memory array 10 includes memory cells MC arranged in columns and rows. A column of the memory cells MC may be arranged along a direction Y, while a row of the memory cells MC may be arranged along a direction X intersected with the direction Y. The memory cells MC in each column are serially connected. In other words, adjacent memory cells MC in each column share a common terminal, such as a source/drain terminal. In addition, the memory cells MC at opposite ends of each column are coupled to a bit line BL by their terminals (e.g., source/drain terminals) that are not shared with other memory cells MC. Other memory cells MC in each column are connected between these boundary memory cells MC. Further, different columns of the memory cells MC are coupled to different bit lines BL. On the other hand, the memory cells MC in each row are connected to a word line WL by their, for example, gate terminals, and different rows of the memory cells MC are connected to different word lines WL.

In some embodiments, the memory array 10 further includes pairs of selection transistors SG. The selection transistors SG of each pair connect the boundary memory cells MC in a memory cell column to the corresponding bit line BL. In other words, columns of the memory cells MC are connected to the bit lines BL through the selection transistors SG. The selection transistors SG are different from the memory cells MC in that the selection transistors SG are not functioned for data storage, but are respectively configured to determine whether current can flow to the memory cells MC from an end of a column of the memory cells MC. The selection transistors SG and the boundary memory cells MC are serially connected by common terminals (e.g., source/drain terminals), and are connected to the bit lines BL by terminals not shared with the boundary memory cells MC (e.g., other source/drain terminals). In addition, yet other terminals (e.g., gate terminals) of the selection transistors SG are respectively coupled to a selection word line SLG.

Figure 1B:
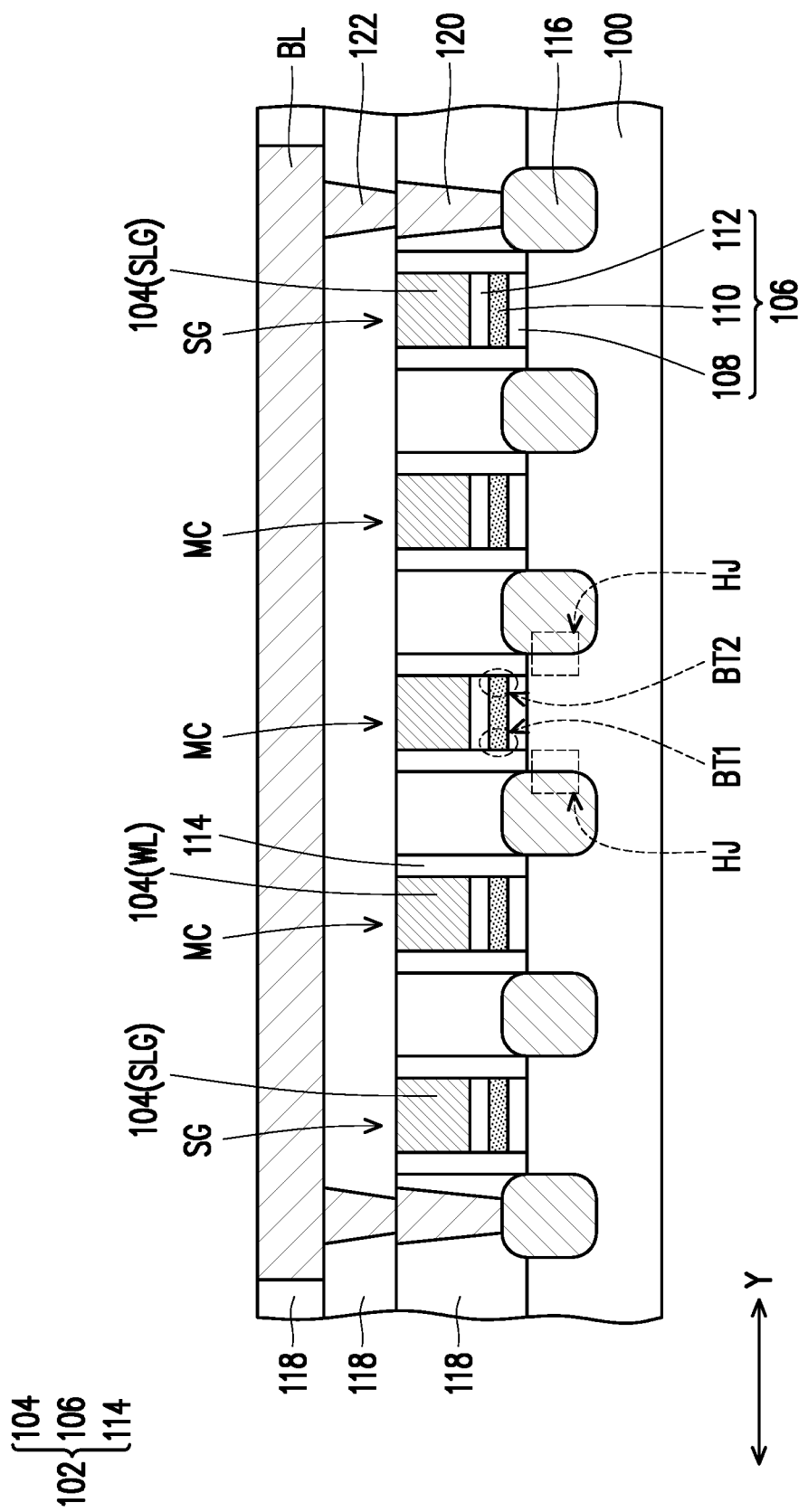
FIG. 1B is a schematic cross-sectional view illustrating structures of a column of the memory cells and the connected selection transistors in the memory array as shown in FIG. 1A, according to some embodiments of the present disclosure.

FIG. 1B is a schematic cross-sectional view illustrating structures of a column of the memory cells MC and the connected selection transistors SG in the memory array 10 as shown in FIG. 1A, according to some embodiments of the present disclosure.

Referring to FIG. 1A and FIG. 1B, in some embodiments, each of the memory cells MC is a flash transistor (or referred as a charge trap flash (CTF) transistor), such as a planar-type flash transistor formed on a shallow region of a substrate 100. The substrate 100 may be a semiconductor wafer or a semiconductor-on-insulator (SOI) wafer. For instance, the substrate 100 may be a silicon wafer or a silicon-on-insulator wafer. The flash transistor includes a gate structure 102. The gate structure 102 is formed on a top surface of the substrate 100, and includes a gate electrode 104 and insulating layers 106 lying between the gate electrode 104 and the substrate 100. The gate electrode 104 is a portion of one of the word lines WL as described with reference to FIG. 1A. In other words, the gate electrode 104 may be a section of a line pattern. In some embodiments, the gate electrode 104 is formed of polysilicon. In addition, in some embodiments, the insulating layers 106 include a tunneling layer 108, a charge trapping layer 110 and a gate dielectric layer 112. The charge trapping layer 110 and the gate dielectric layer 112 are successively stacked on the tunneling layer 108. In other words, the tunneling layer 108 lies between the substrate 100 and the charge trapping layer 110, and the charge trapping layer 110 is sandwiched between the tunneling layer 108 and the gate dielectric layer 112. Further, the gate dielectric layer 112 may be in contact with the overlying gate electrode 104. In some embodiments, the tunneling layer 108 and the gate dielectric layer 112 are formed of silicon oxide, while the charge trapping layer 110 is formed of silicon nitride. In these embodiments, the insulating layers 106 could be regarded as a silicon oxide-silicon nitride-silicon oxide (ONO) multilayer structure. In certain embodiments, an additional charge trapping layer and an additional gate dielectric layer are further disposed between the gate dielectric layer 112 and the gate electrode 104, and the additional charge trapping layer is sandwiched between the gate dielectric layers (including the gate dielectric layer 112 and the additional gate dielectric layer). Furthermore, in some embodiments, the gate structure 102 further includes sidewall spacers 114 covering sidewalls of a stacking structure including the gate electrode 104 and the insulating layers 106. The sidewall spacer 114 is formed of an insulating material, such as silicon oxide, silicon nitride, silicon oxynitride or combinations thereof.

In addition to the gate structure 102, the flash transistor (i.e., the memory cell MC) further includes source/drain structures 116 at opposite sides of the gate structure 102. A skin portion of the substrate 100 covered by the gate structure 102 and extending between the source/drain structures 116 is functioned as a channel region of the flash transistor (i.e., the memory cell MC), and may be doped to have a conductive type (e.g., P type) complementary (opposite) to a conductive type (e.g., N type) of the source/drain structures 116. When the flash transistor is turned on, a conductive path may be formed in the channel region. On the other hand, when the flash transistor is in an off state, the conductive path may be cut off or absent. Due to an effect similar to a band-to-band (BTB) hot carrier injection effect, charges from the source/drain structures 116 may be drawn to the charge trapping layer 110 during a programming operation. The charge may come from each of the source/drain structures 116 at opposite sides of the gate structure 102, and inject into sites of the charge trapping layer 110 close to the source/drain structures 116, respectively. These sites of the charge trapping layer 110 are spaced apart from each other, and labeled as sites BT1, BT2 in FIG. 1B. Since the charge trapping layer 110 is electrically insulating, these sites BT1, BT2 of the charge trapping layer 110 can be independently programmed. In other words, the site BT1 can be programmed with a data bit while the site BT2 remains in an initial state (without charges inserted), or vice versa. The source/drain structures 116 are formed of a material having a bandgap higher or lower than a bandgap of a semiconductor material of the substrate 100. Accordingly, a heterojunction HJ can be formed at an interface between each source/drain structure 116 and the channel region. As a result of the heterojunctions HJ, band-to-band (BTB) tunneling current flowing from the source/drain structures 116 to the substrate 100 can be significantly increased, and can be effectively sensed. As will be further described with reference to FIG. 2C and FIG. 2D, such BTB tunneling current can be utilized as read current during a read operation. Furthermore, as a result of applying the BTB tunneling current for read operation, data bits stored in the sites BT1, BT2 can be independently sensed. In those embodiments where the semiconductor material in the substrate 100 includes silicon, the source/drain structures 116 may be formed of SiGe, Ge, GeSn, GaAs, GaN, SiC or other semiconductor material having bandgap different from bandgap of silicon. Moreover, in some embodiments, the source/drain structures 116 are disposed in recesses at the top surface of the substrate 100, and the source/drain structures 116 may or may not protrude from the topmost surface of the substrate 100. It should be noted that, for conciseness, only a single one of the memory cells MC is labeled with the sites BT1, BT2 and the heterojunctions HJ. In addition, although only three memory cells MC are depicted in a column, there may actually be more memory cells MC in each column (e.g., 32 memory cells MC in each column).

Adjacent flash transistors in the same column (i.e., adjacent memory cells MC in the same column) share a common source/drain structure 116. Further, each selection transistor SG and an adjacent flash transistor share a common source/drain structure 116 as well. In some embodiments, the selection transistors SG are structurally identical with the memory cells MC. In those embodiments where the memory cells MC are flash transistors (e.g., the planar-type flash transistors), the selection transistors SG may also be flash transistors (e.g., the planar-type flash transistors). The gate electrodes 104 of the selection transistors SG may be portions of the selection word lines SLG as described with reference to FIG. 1A. Furthermore, in some embodiments, a stack of dielectric layers 118 are formed on the substrate 100. The gate structures 102 of the memory cells MC and the selection transistors SG may be laterally surrounded by a bottommost one of the dielectric layers 118. Contact plugs 120 may penetrate through the bottommost dielectric layer 118 along a vertical direction to establish electrical connection with the source/drain structures 116 of the selection transistors SG not shared with the memory cells MC. The bit line BL may be formed in one of the dielectric layers 118 over the bottommost dielectric layer 118 (e.g., the third bottommost dielectric layer 118). In addition, conductive vias 122 may be formed in one of the dielectric layers 118 between the bit line BL and the contact plugs 118. The conductive vias 122 may stand on the contact plugs 120, and extend to a bottom surface of the bit line BL, so as to electrically connect the contact plugs 120 to the bit line BL.

Figure 2A:
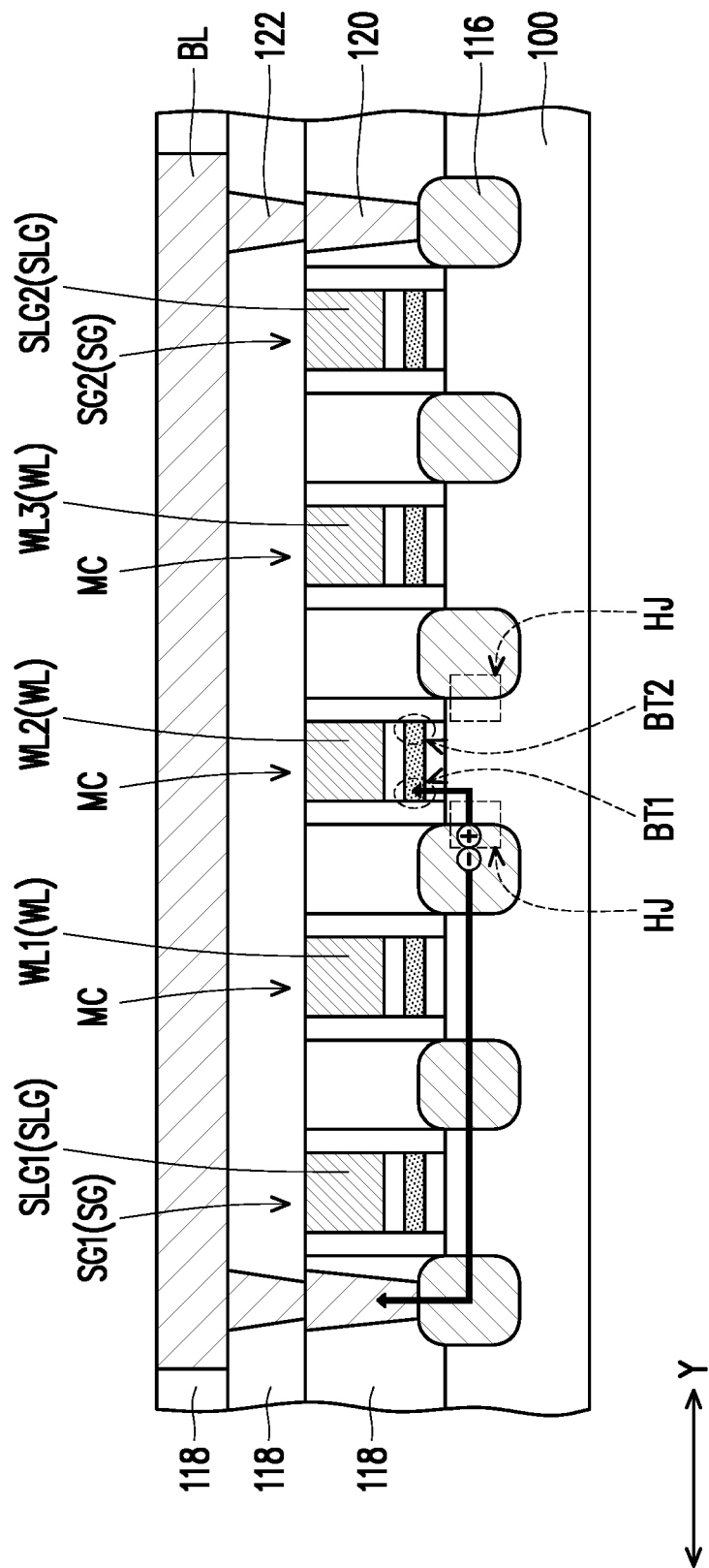
FIG. 2A illustrates a scheme for writing a data bit into a selected one of the memory cells in a column according to some embodiments of the present disclosure.
Figure 2B:
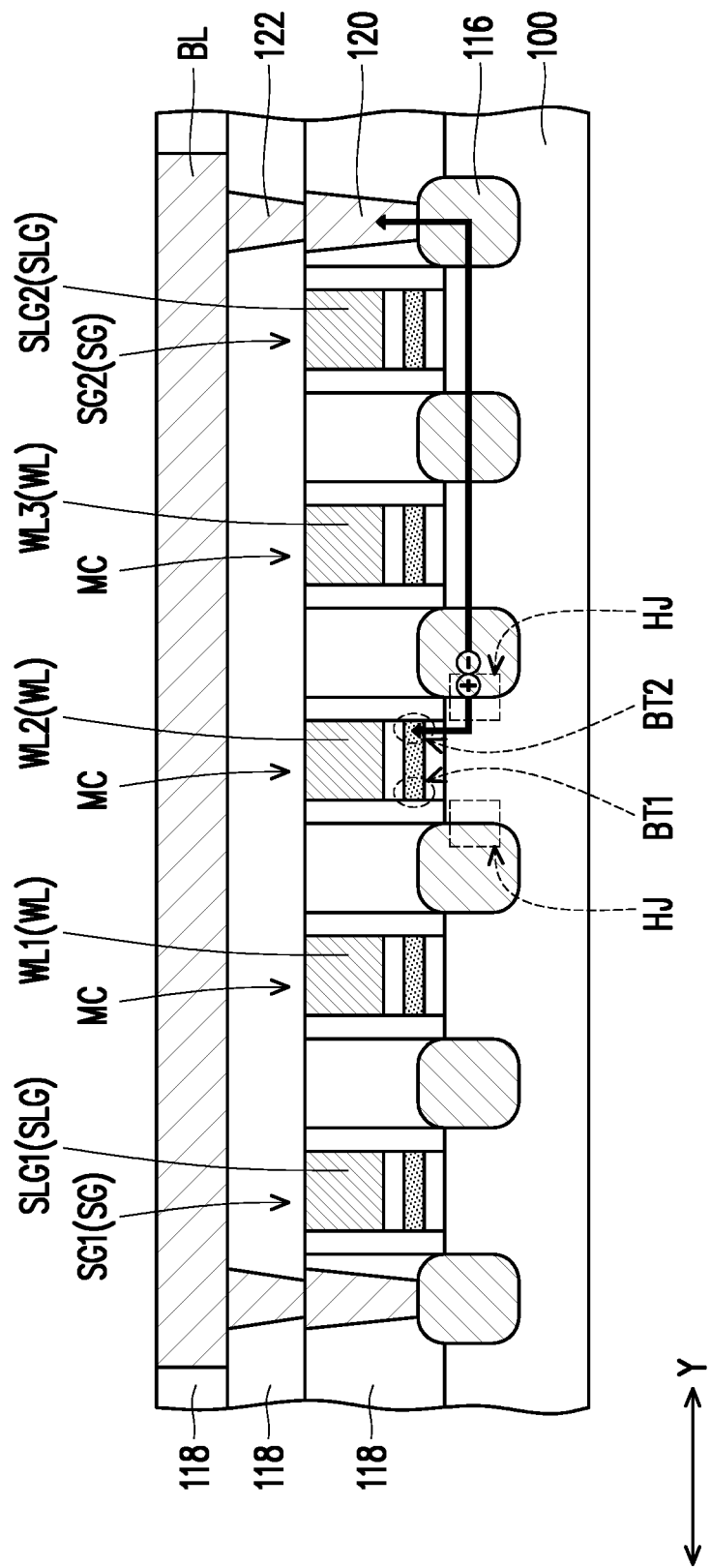
FIG. 2B illustrates a scheme for writing another data bit into the selected one of the memory cells in the column according to some embodiments of the present disclosure.

FIG. 2A illustrates a scheme for writing a data bit into a selected one of the memory cells MC in a column according to some embodiments of the present disclosure. FIG. 2B illustrates a scheme for writing another data bit into the selected one of the memory cells MC in the column according to some embodiments of the present disclosure.

Referring to FIG. 2A, for illustration purpose, the word lines WL (including the gate electrodes 104 as described with reference to FIG. 1B) are successively numbered as a word line WL1, a word line WL2 and a word line WL3. Similarly, the selection word lines SLG are numbered as a selection word line SLG1 and a selection word line SLG2. The selection word line SLG1 is adjacent to the word line WL1, while the selection word line SLG2 is adjacent to the word line WL3. Further, the site BT1 in each memory cell MC is closer to the selection transistor SG coupled to the selection word line SLG1 (also referred as a selection transistor SG1) than the site BT2 in the same memory cell MC. On the other hand, the site BT2 in each memory cell MC is closer to the selection transistor SG coupled to the selection word line SLG2 (also referred as a selection transistor SG2) than the site BT1 in the same memory cell MC. In order to program the site BT1 of a selected memory cell MC, the selection transistor SG1 in the same column is turned on, along with the memory cell(s) MC (if any) between the selected memory cell MC and the selection transistor SG1. Accordingly, current could flow through the channel regions of the selection transistor SG1 and the memory cells MC (if any) between the selected memory cell MC and the selection transistor SG1, to one of the source/drain structures 116 of the selected memory cell MC that is closer to the selection transistor SG1. An electron flow, which is opposite to the current flow, is indicated by the arrow pointed toward the bit line BL as shown in FIG. 2A. In addition, the word line WL coupled to the selected memory cell MC is configured to receive a voltage for drawing charges from this source/drain structure 116 to the site BT1 by an effect similar to a BTB hot carrier injection effect (as indicated by the arrow pointed toward the charge trapping layer 110 in FIG. 2A). On the other hand, the selection transistor SG2 is kept in an off state, along with the memory cell(s) MC (if any) between the selected memory cell MC and the selection transistor SG2. Therefore, there may not be current flowing to the other source/drain structure 116 of the selected memory cell MC from the selection transistor SG2, thus the site BT2 can be kept from being programmed while programming the site BT1. For instance, when the site BT1 of the memory cell MC coupled to the word line WL2 is selected for programming, the selection transistor SG1 and the memory cell MC coupled to the word line WL1 are turned on, while the selection transistor SG2 and the memory cell MC coupled to the word line WL3 are kept in an off state. Meantime, the word line WL2 is configured to receive a voltage for drawing charges into the site BT1. In those embodiments where the memory cells MC and the selection transistors SG1, SG2 are N-type transistors, the selection word line SLG1 and the word lines WL1, WL2 are respectively configured to receive a positive voltage, while the selection word line SLG2 and the word line WL3 are respectively grounded or configured to receive a reference voltage that is incapable of turning on the selection transistors SG2 and the memory cell MC coupled to the word line WL3. Considering the memory cell MC coupled to the word line WL1 may be previously programmed, the word line WL1 may receive a positive voltage high enough to ensure that this memory cell MC can be turned on by this positive voltage. On the other hand, since the selection transistor SG1 is not functioned for storing data bit(s), a relatively low positive voltage can ensure an on state of the selection transistor SG1. For instance, the word line WL1 may receive a positive voltage of 10V, while the selection word line SLG1 may receive a positive voltage of 8V. In some embodiments, the memory cells MC are programmed by inserting holes into the charge trapping layers 110. In these embodiments, the word line WL2 coupled to the selected memory cell MC is configured to receive a negative voltage (e.g., −7V), thus the site BT1 can be inserted with holes.

In alternative embodiments where the memory cells MC and the selection transistors SG1, SG2 are P-type transistors, the selection word line SLG1 and the word line WL1 are respectively configured to receive a negative voltage during the above-described programming operation. On the other hand, the selection word line SLG2 and the word line WL3 are respectively grounded or configured to receive a reference voltage that is incapable of turning on the selection transistor SG2 and the memory cell MC coupled to the word line WL3. In addition, the selected memory cell MC coupled to the word line WL2 may be programmed by inserting electrons into the charge trapping layer 110, and the word line WL2 may receive a positive voltage during the read operation. For instance, the word line WL1 may receive a negative voltage of −10V; the selection word line SLG1 may receive a negative voltage of −8V; the word line WL3 and the selection word line SLG2 may be grounded; and the word line WL2 may receive a positive voltage of 7V.

Referring to FIG. 2B, in order to program the site BT2 of a selected memory cell MC, the selection transistor SG2 in the same column is turned on, along with the memory cell(s) MC (if any) between the selected memory cell MC and the selection transistor SG2. In addition, the word line WL coupled to the selected memory cell MC is configured to receive a voltage for drawing charges to the site BT2 of the selected memory cell MC by an effect similar to the BTB hot carrier injection effect. On the other hand, the selection transistor SG1 is kept in an off state, along with the memory cell(s) MC (if any) between the selected memory cell MC and the selection transistor SG1. For instance, when the site BT2 of the memory cell MC coupled to the word line WL2 is selected for programming, the selection transistor SG2 and the memory cells MC coupled to the word line WL3 are turned on, while the selection transistor SG1 and the memory cell MC coupled to the word line WL1 are kept in an off state. Meantime, the word line WL2 is configured to receive a voltage for drawing charges into the site BT2. In those embodiments where the memory cells MC and the selection transistors SG1, SG2 are N-type transistors, the selection word line SLG2 and the word line WL3 are respectively configured to receive a positive voltage; the selection word line SLG1 and the word line WL1 are respectively grounded or configured to receive a reference voltage that is incapable of turning on the selection transistors SG1 and the memory cell MC coupled to the word line WL1; and the word line WL2 is configured to receive a negative voltage for drawing holes to the site BT2. For instance, the selection word line SLG2 may receive a positive voltage of 8V; the word line WL3 may receive a positive voltage of 10V; the selection word line SLG1 and the word line WL1 may be grounded; and the word line WL2 may receive a negative voltage of −7V. In alternative embodiments where the memory cells MC and the selection transistors SG1, SG2 are P-type transistors, the selection word line SLG2 and the word line WL3 are respectively configured to receive a negative voltage, while the selection word line SLG1 and the word line WL1 are grounded or configured to receive a reference voltage. For instance, the selection word line SLG2 may receive a negative voltage of −8V, while the word line WL3 may receive a negative voltage of −10V. In addition, the word line WL2 coupled to the selected memory cell MC may be configured to receive a positive voltage (e.g., 7V), such that electrons may be drawn to the site BT2, in order to program the site BT2 of the selected memory cell MC.

Figure 2C:
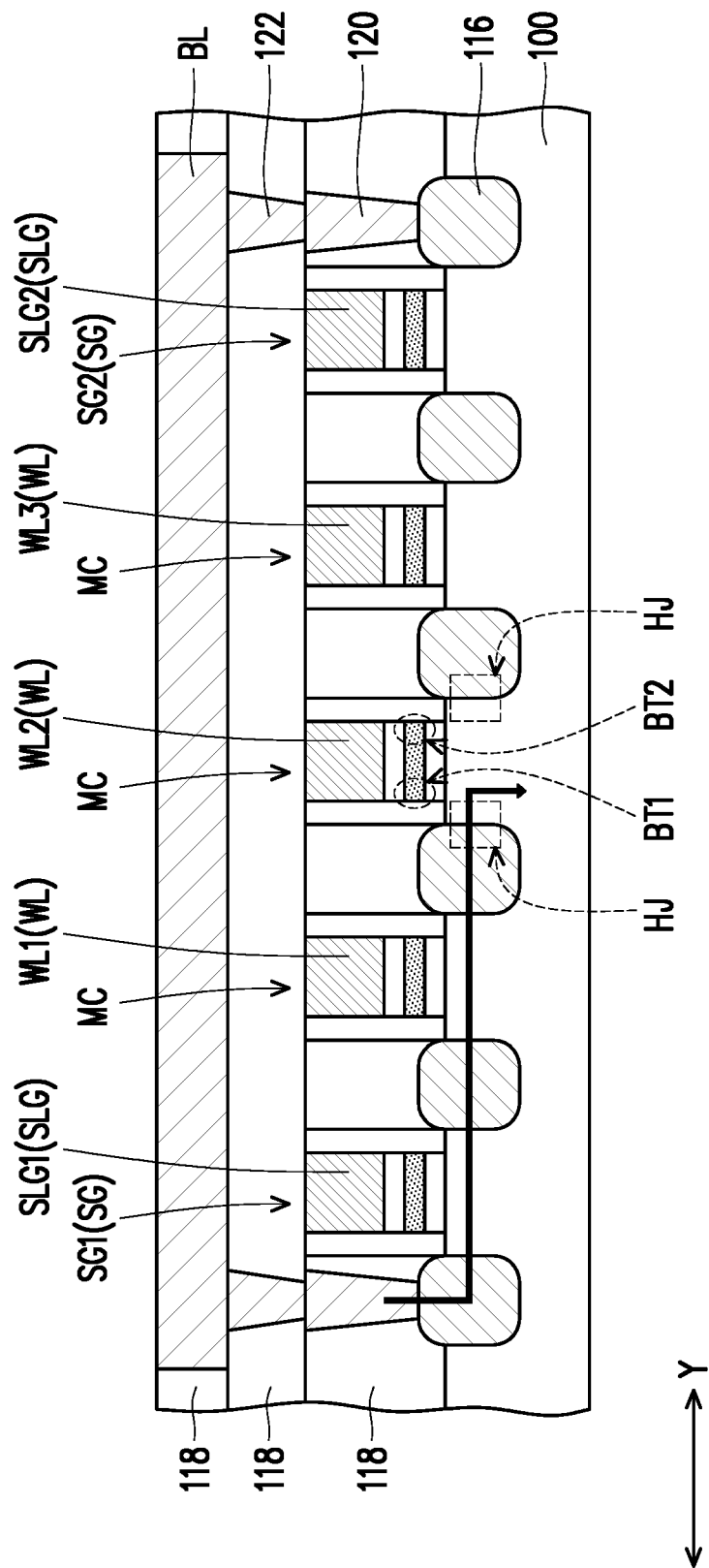
FIG. 2C illustrates a scheme for sensing one of the programming sites in a selected one of the memory cells in a column, according to some embodiments of the present disclosure.
Figure 2D:
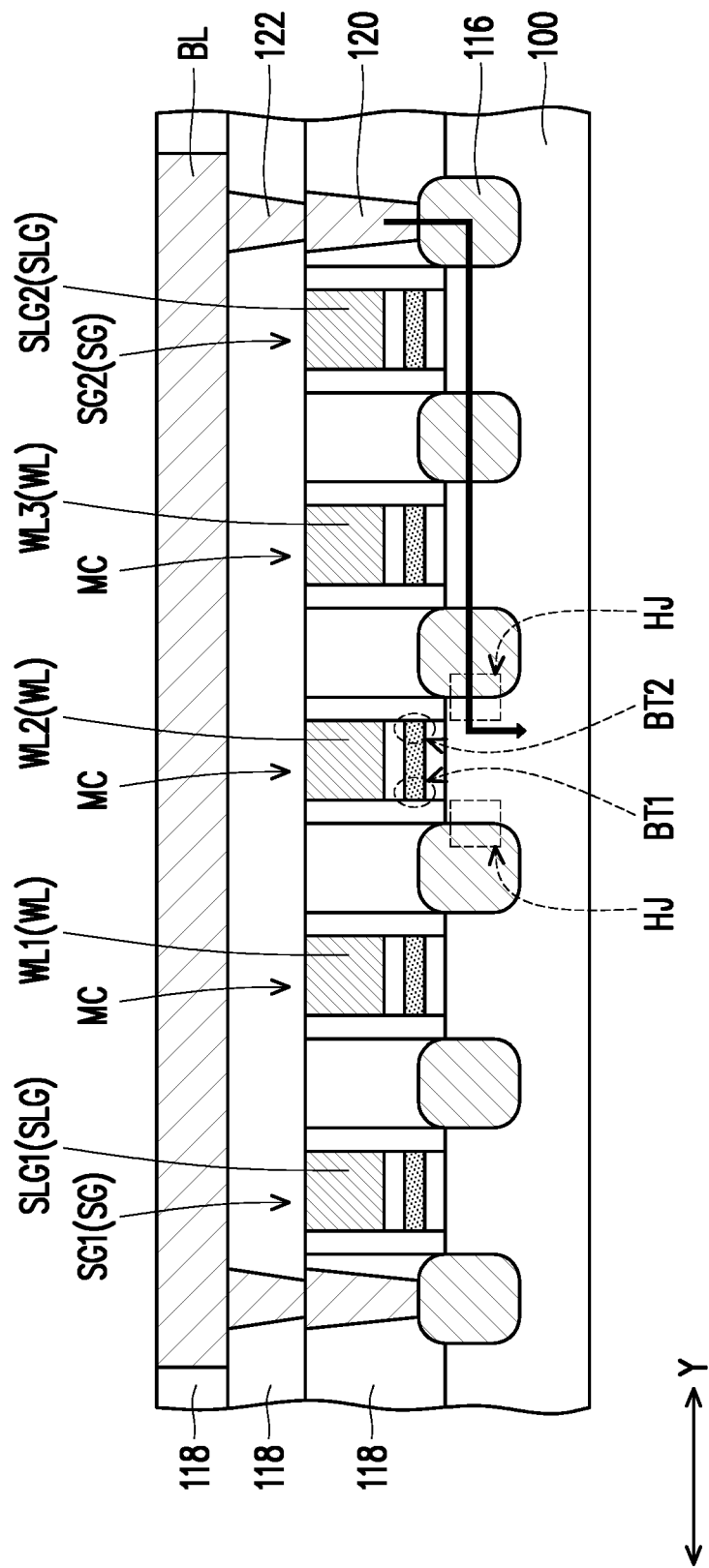
FIG. 2D illustrates a scheme for sensing another one of the programming sites in the selected one of the memory cells in a column, according to some embodiments of the present disclosure.

FIG. 2C illustrates a scheme for sensing one of the programming sites BT1, BT2 in a selected one of the memory cells MC in a column, according to some embodiments of the present disclosure. FIG. 2D illustrates a scheme for sensing another one of the programming sites BT1, BT2 in the selected one of the memory cells MC in a column, according to some embodiments of the present disclosure.

Referring to FIG. 2C, during a read operation for sensing the site BT1 in a selected memory cell MC, the selection transistor SG1 in the same column is turned on, along with the memory cell(s) MC (if any) between the selected memory cell MC and this selection transistor SG1. Accordingly, current could flow through the channel regions of the selection transistor SG1 and the memory cells MC (if any) between the selected memory cell MC and the selection transistor SG1, to one of the source/drain structures 116 of the selected memory cell MC that is closer to the selection transistor SG1. In addition, the word line WL coupled to the selected memory cell MC is configured to receive a voltage for altering (shifting) electronic band structure of a channel region of the selected memory cell MC, such that band bending may occur at an interface between the one of the source/drain structures 116 and the channel region of the selected memory cell MC. However, the voltage received by this word line WL may not turn on the selected memory cell MC, thus a conductive path extending from one of the source/drain structures 116 of the selected memory cell MC to another may not be formed. If the site BT1 of the selected memory cell MC was programmed, the charges stored in the site BT1 may further enhance the band bending at the afore-mentioned interface, such that BTB tunneling current may flow through such interface to the substrate 100 from the one of the source/drain structures 116 (as indicated by the arrow shown in FIG. 2C). On the other hand, if the site BT1 was not programmed, there may not be (or very few) tunneling current flowing through such interface. By sensing substrate current (i.e., current flowing to the substrate 100 from the one of the source/drain structures 116 of the selected memory cell MC), a charge state of the site BT1 of the selected memory cell MC can be identified. In those embodiments where the source/drain structures 116 and the substrate 100 are formed of materials having different bandgaps, heterojunctions HJ can be formed at the interfaces between the channel regions and the source/drain structures 116, and the BTB tunneling current can be raised. Therefore, read margin can be increased. On the other hand, the selection transistor SG2 is kept in an off state, along with the memory cell(s) MC (if any) between the selected memory cell MC and the selection transistor SG2. Therefore, there may not be current flowing to the other source/drain structure 116 of the selected memory cell MC from the selection transistor SG2. Also, the selected memory cell MC may be kept in an off state. Accordingly, there may not be BTB tunneling current flowing from this source/drain structure 116 (the source/drain structure 116 closer to the site BT2) to the substrate 100, no matter the site BT2 was programmed or not. In other words, the read operation for sensing the site BT1 would not be affected by a charge state of the site BT2. For instance, when the site BT1 of the memory cell MC coupled to the word line WL2 is selected for a read operation, the selection transistor SG1 and the memory cell MC coupled to the word line WL1 are turned on, while the selection transistor SG2 and the memory cell MC coupled to the word line WL3 are kept in an off state. Further, the word line WL2 coupled to the selected memory cell MC is configured to receive a voltage for altering the electronic band structure at the heterojunction HJ close to the site BT1 of the selected memory cell MC. In those embodiments where the memory cells MC and the selection transistors SG1, SG2 are N-type transistors, the selection word line SLG1 and the word line WL1 are respectively configured to receive a positive voltage, while the selection word line SLG2 and the word line WL3 are grounded or respectively configured to receive a reference voltage that is incapable of turning on the selection transistors SG2 and the memory cell MC coupled to the word line WL3. Considering the memory cell MC coupled to the word line WL1 may be previously programmed, the word line WL1 may receive a positive voltage high enough to ensure that this memory cell MC can be turned on by this positive voltage. On the other hand, since the selection transistor SG1 is not functioned for storing data bit(s), a relatively low positive voltage can ensure an on state of the selection transistor SG1. For instance, the word line WL1 may receive a positive voltage of 10V, while the selection word line SLG1 may receive a positive voltage of 8V. In some embodiments, the word line WL2 coupled to the selected memory cell MC is configured to receive a negative voltage, such as a negative voltage of −10V.

In alternative embodiments where the memory cells MC and the selection transistors SG1, SG2 are P-type transistors, the selection word line SLG1 and the word line WL1 are respectively configured to receive a negative voltage during the above-described read operation. On the other hand, the selection word line SLG2 and the word line WL3 are respectively grounded or configured to receive a reference voltage that is incapable of turning on the selection transistor SG2 and the memory cell MC coupled to the word line WL3. In addition, the word line WL2 coupled to the selected memory cell MC may be configured to receive a positive voltage. For instance, the selection word line SLG1 may receive a negative voltage of −8V; the word line WL1 may receive a negative voltage of −10V; the word line WL3 as well as the selection word line SLG2 may be grounded; the word line WL2 may receive a positive voltage of 10V.

Referring to FIG. 2D, during a read operation for sensing the site BT2 in a selected memory cell MC, the selection transistor SG2 in the same column is turned on, along with the memory cell(s) MC (if any) between the selected memory cell MC and the selection transistor SG2. On the other hand, the selection transistor SG1 is kept in an off state, along with the memory cell(s) MC (if any) between the selected memory cell MC and the selection transistor SG1. In addition, the word line WL coupled to the selected memory cell MC is configured to receive a voltage for altering (shifting) an electronic band structure of a portion of the substrate 100 overlapped with this word line WL, such that desired band bending may occur at an interface between the portion of the substrate 100 and one of the source/drain structures 116 of the selected memory cell MC closer to the site BT2. For instance, during a read operation for sensing the site BT2 in the memory cell MC coupled to the word line WL2, the selection transistor SG2 and the memory cells MC coupled to the word line WL3 are turned on, while the selection transistor SG1 and the memory cell MC coupled to the word line WL1 are kept in an off state. Meantime, the word line WL2 is configured to receive a voltage for altering the electronic band structure of an underlying portion of the substrate 100. In those embodiments where the memory cells MC and the selection transistors SG1, SG2 are N-type transistors, the selection word line SLG2 and the word line WL3 are respectively configured to receive a positive voltage; the selection word line SLG1 and the word line WL1 are respectively grounded or configured to receive a reference voltage that is incapable of turning on the selection transistors SG1 and the memory cell MC coupled to the word line WL1; and the word line WL2 is configured to receive a negative voltage. For instance, the selection word line SLG2 may receive a positive voltage of 8V; the word line WL3 may receive a positive voltage of 10V; the selection word line SLG1 and the word line WL1 may be grounded; and the word line WL2 may receive a negative voltage of −10V. In alternative embodiments where the memory cells MC and the selection transistors SG1, SG2 are P-type transistors, the selection word line SLG2 and the word line WL3 are respectively configured to receive a negative voltage, while the selection word line SLG1 and the word line WL1 are grounded or configured to receive a reference voltage. For instance, the selection word line SLG2 may receive a negative voltage of −8V, while the word line WL3 may receive a negative voltage of −10V. In addition, the word line WL2 coupled to the selected memory cell MC may be configured to receive a positive voltage, such as a positive voltage of 10V.

Figure 2E:
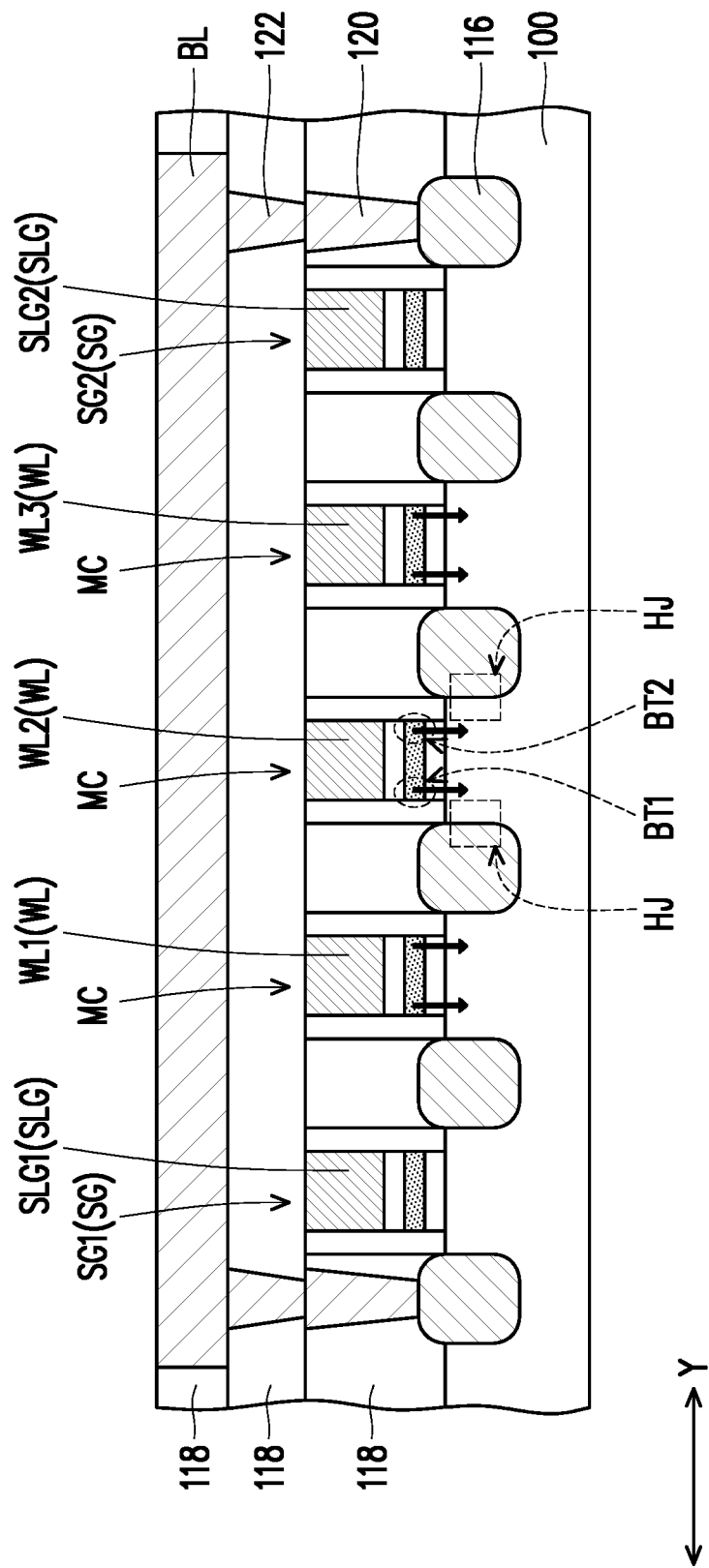
FIG. 2E illustrates an erase scheme for a column of the memory cells according to some embodiments of the present disclosure.

FIG. 2E illustrates an erase scheme for a column of the memory cells MC according to some embodiments of the present disclosure.

Referring to FIG. 2E, during an erase operation, both sites BT1, BT2 of each memory cell MC in the same column are subjected to erase. A Fowler-Nordheim (FN) tunneling effect can be used for realizing the erase operation. In those embodiments where holes are used for programming the memory cells MC, the word lines WL are configured to receive a negative voltage (e.g., −9V), while the substrate 100 is configured to receive a positive voltage (e.g., 10V). Due to a large voltage difference between the word lines WL and the substrate 100, the holes stored in the sites BT1, BT2 may tunnel through the tunneling layer 108, and are erased from the sites BT1, BT2. In alternative embodiments where electrons are used for programming the memory cells MC, the word lines WL may be configured to receive a positive voltage (e.g., 9V), while the substrate 100 may be configured to receive a negative voltage (e.g., −10V), so as to erase the electrons stored in the sites BT1, BT2. Moreover, in some embodiments, the selection transistors SG1, SG2 are kept in an off state during an erase operation. In these embodiments, the selection word lines SLG are configured to be grounded or receive a reference voltage incapable of turning on the selection transistors SG1, SG2.

Figure 3:
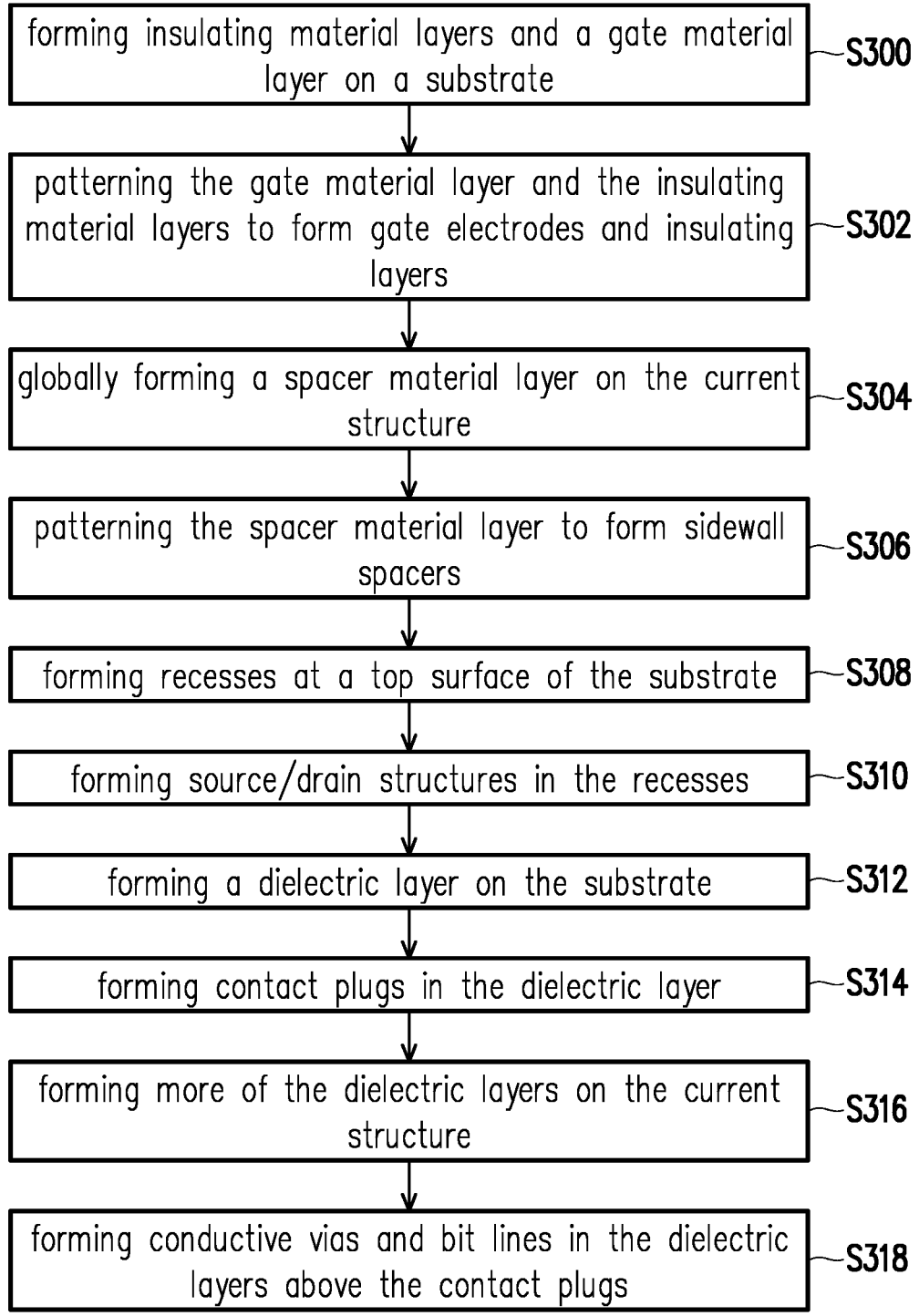
FIG. 3 is a flow diagram illustrating a manufacturing method for forming the memory array according to some embodiments of the present disclosure.

FIG. 3 is a flow diagram illustrating a manufacturing method for forming the memory array 10 according to some embodiments of the present disclosure. FIG. 4A through FIG. 4I are schematic cross-sectional views illustrating intermediate structures at various stages during formation of the memory array 10 by using the manufacturing method as shown in FIG. 3. It should be noted that, for conciseness, formation of a single column of the memory cells MC in the memory array 10 will be used for illustrating the formation of the memory array 10.

Figure 4A:
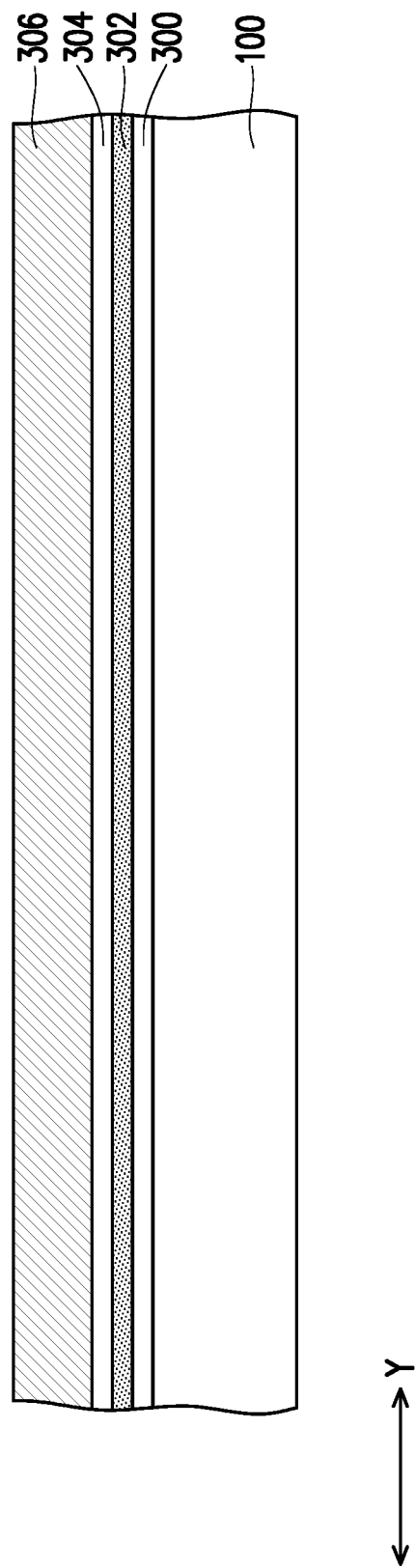
FIG. 4A through FIG. 4I are schematic cross-sectional views illustrating intermediate structures at various stages during formation of the memory array by using the manufacturing method as shown in FIG. 3.

Referring to FIG. 3 and FIG. 4A, step S300 is performed, and insulating material layers 300, 302, 304 and a gate material layer 306 are formed on the substrate 100. The insulating material layers 300, 302, 304 will be patterned to form the tunneling layer 108, the charge trapping layer 110 and the gate dielectric layer 112 as shown in FIG. 1B, respectively. In addition, the gate material layer 306 will be patterned to form the gate electrode 104 as shown in FIG. 1B.

Figure 4B:
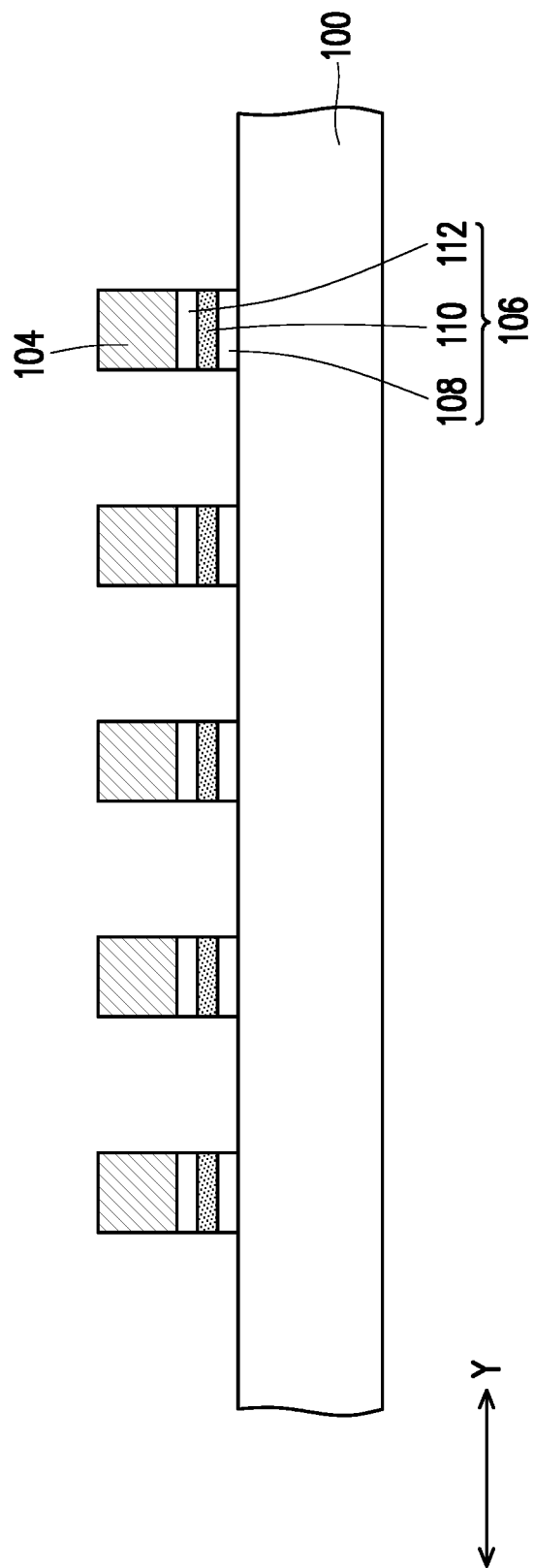

Referring to FIG. 3 and FIG. 4B, step S302 is performed, and the gate material layer 306 as well as the insulating material layers 300, 302, 304 are patterned. The gate material layer 306 is patterned to form the gate electrode 104. The insulting material layers 300, 302, 304 are patterned to form the tunneling layer 108, the charge trapping layer 110 and the gate dielectric layer 112, respectively. In some embodiments, a mask pattern (not shown), such as a photoresist pattern or a hard mask pattern, may be used as a shadow mask during an etching process for patterning the gate material layer 306 and the insulating material layers 300, 302, 304.

Figure 4C:
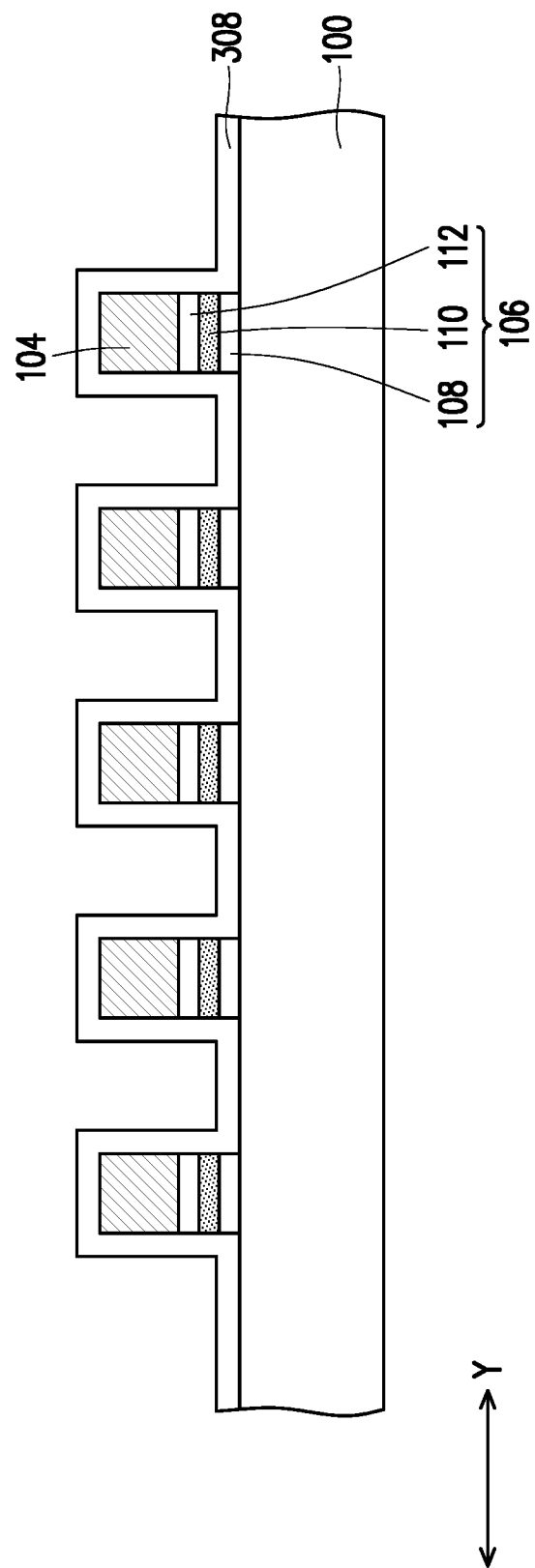

Referring to FIG. 3 and FIG. 4C, step S304 is performed, and a spacer material layer 308 is globally formed on the current structure. The spacer material layer 308 will be patterned to form the sidewall spacers 114 as described with reference to FIG. 1B. In some embodiments, the spacer material layer 308 conformally covers the substrate 100 and stacking structures respectively including one of the gate electrodes 104 and the underlying gate dielectric layer 112, charge trapping layer 110 and tunneling layer 108.

Figure 4D:
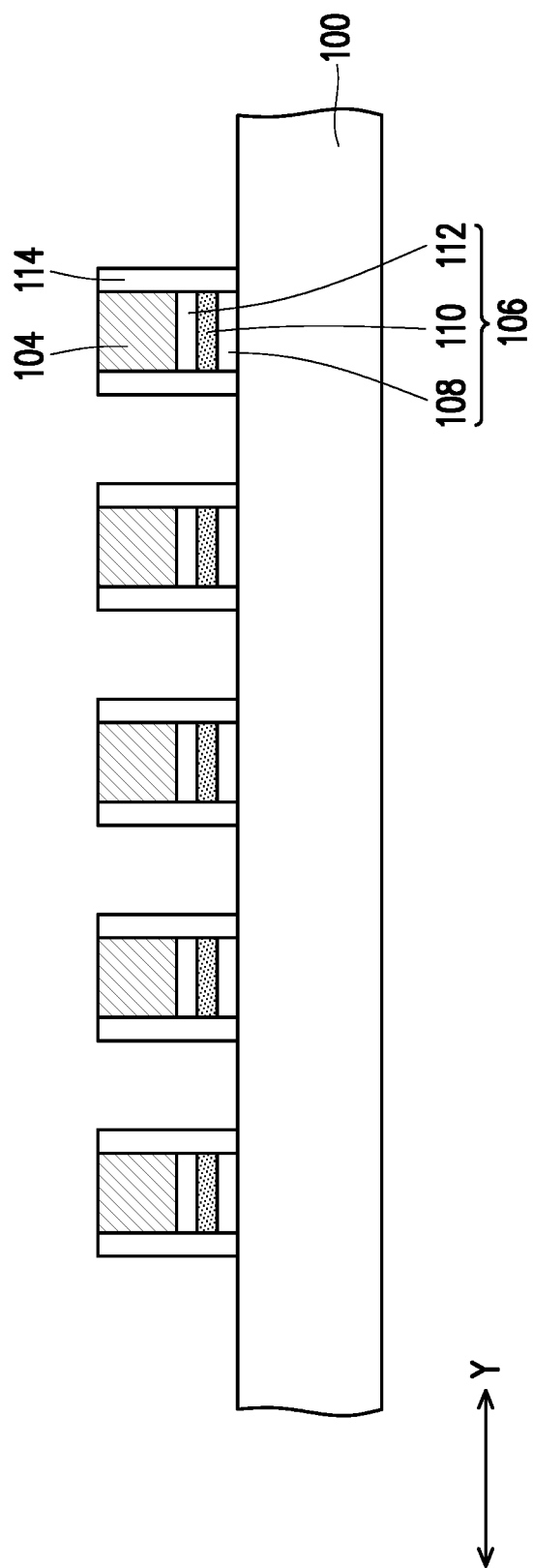

Referring to FIG. 3 and FIG. 4D, step S306 is performed, and the spacer material layer 308 is patterned to form the sidewall spacers 114. Portions of the spacer material layer 308 laterally extending on top surfaces of the gate electrodes 114 and a top surface of the substrate 100 are removed, while portions of the spacer material layer 308 covering sidewalls of the gate electrodes 104, the gate dielectric layers 112, the charge trapping layers 110 and the tunneling layers 108 are remained to form the sidewall spacers 114. In some embodiments, an anisotropic etching process is used for patterning the spacer material layer 308 to form the sidewall spacers 114.

Figure 4E:
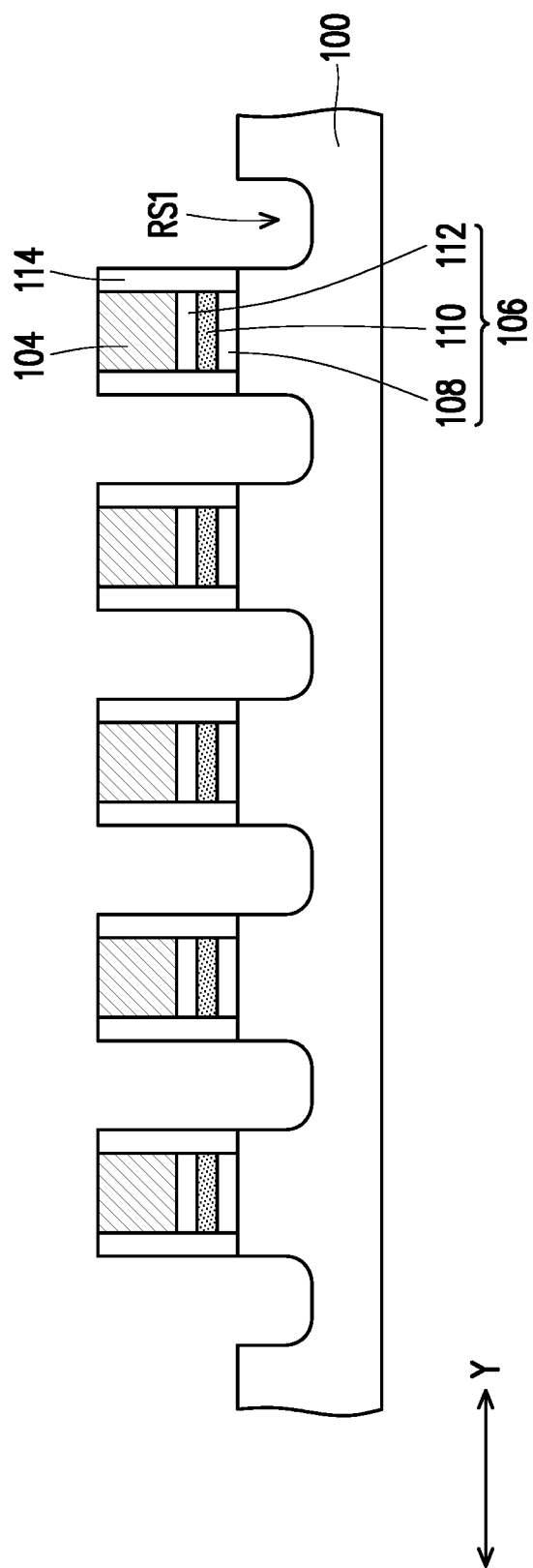

Referring to FIG. 3 and FIG. 4E, step S308 is performed, and recesses RS1 are formed at the top surface of the substrate 100. The recesses RS1 are formed for accommodating the source/drain structures 116 to be formed in the following step. In some embodiments, a lithography process and an etching process are used for forming the recesses RS1.

Figure 4F:
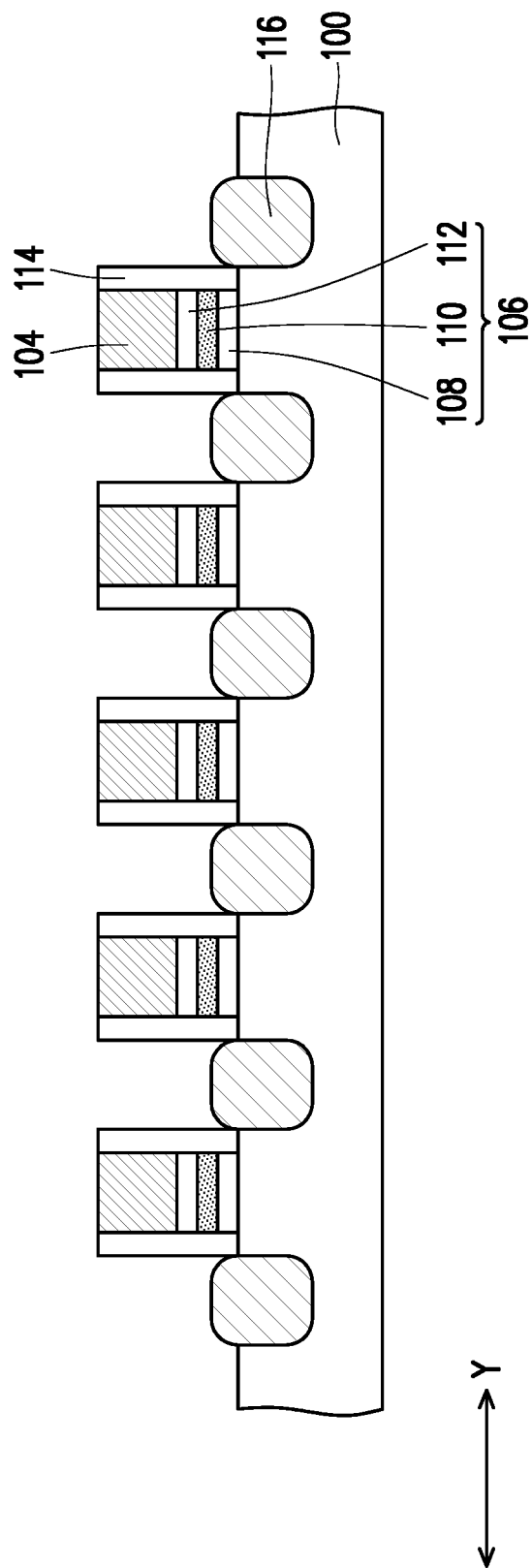

Referring to FIG. 3 and FIG. 4F, step S310 is performed, and the source/drain structures 116 are formed in the recesses RS1. In some embodiments, a method for forming the source/drain structures 116 includes an epitaxial process. Up to here, the memory cells MC and the selection transistors SG as described with reference to FIG. 1B are formed.

Figure 4G:
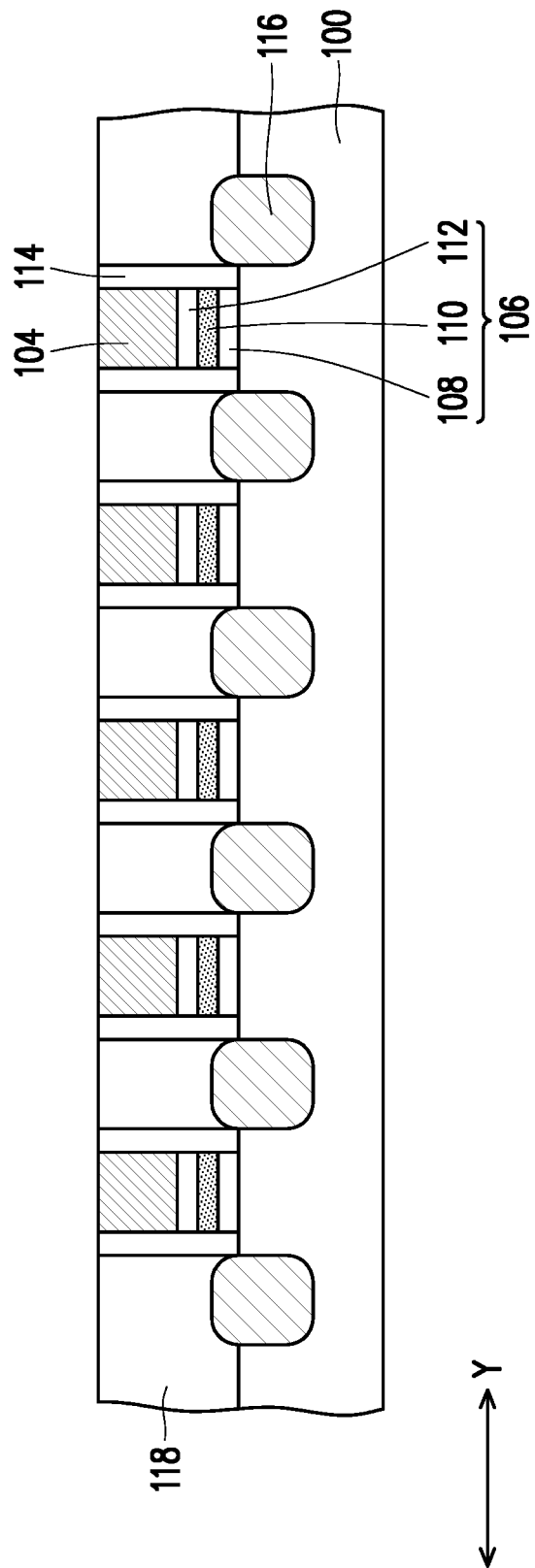

Referring to FIG. 3 and FIG. 4G, step S312 is performed, and the bottommost dielectric layer 118 is formed. In some embodiments, a method for forming the bottommost dielectric layer 118 includes globally forming a dielectric material layer on the structure as shown in FIG. 4F, and portions of the dielectric material layer above the gate electrodes 104 and the sidewall spacers 114 are then removed. The remained portions of the dielectric material layer form the bottommost dielectric layer 118.

Figure 4H:
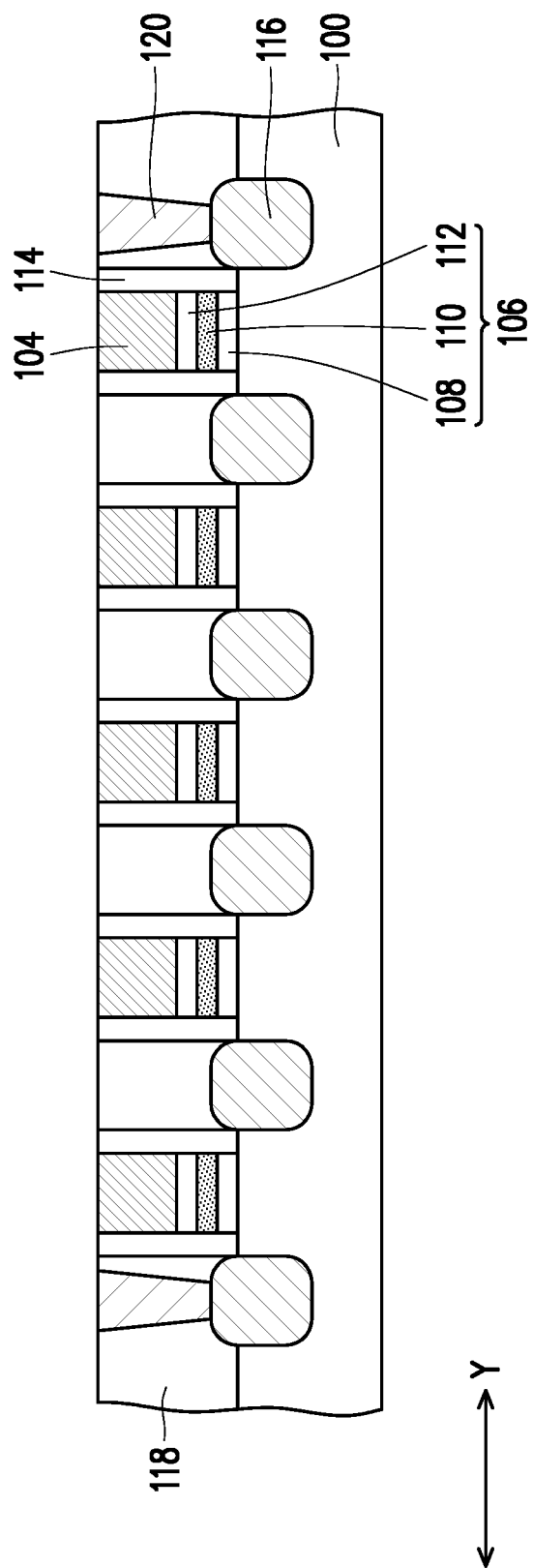

Referring to FIG. 3 and FIG. 4H, step S314 is performed, and the contact plugs 120 are formed in the bottommost dielectric layer 118. In some embodiments, a method for forming the contact plugs 120 includes forming through holes in the bottommost dielectric layer 118, and filling a conductive material into the through holes. Subsequently, portions of the conductive material above the bottommost dielectric layer 118 are removed, and portions of the conductive material remained in the through holes form the contact plugs 120.

Figure 4I:
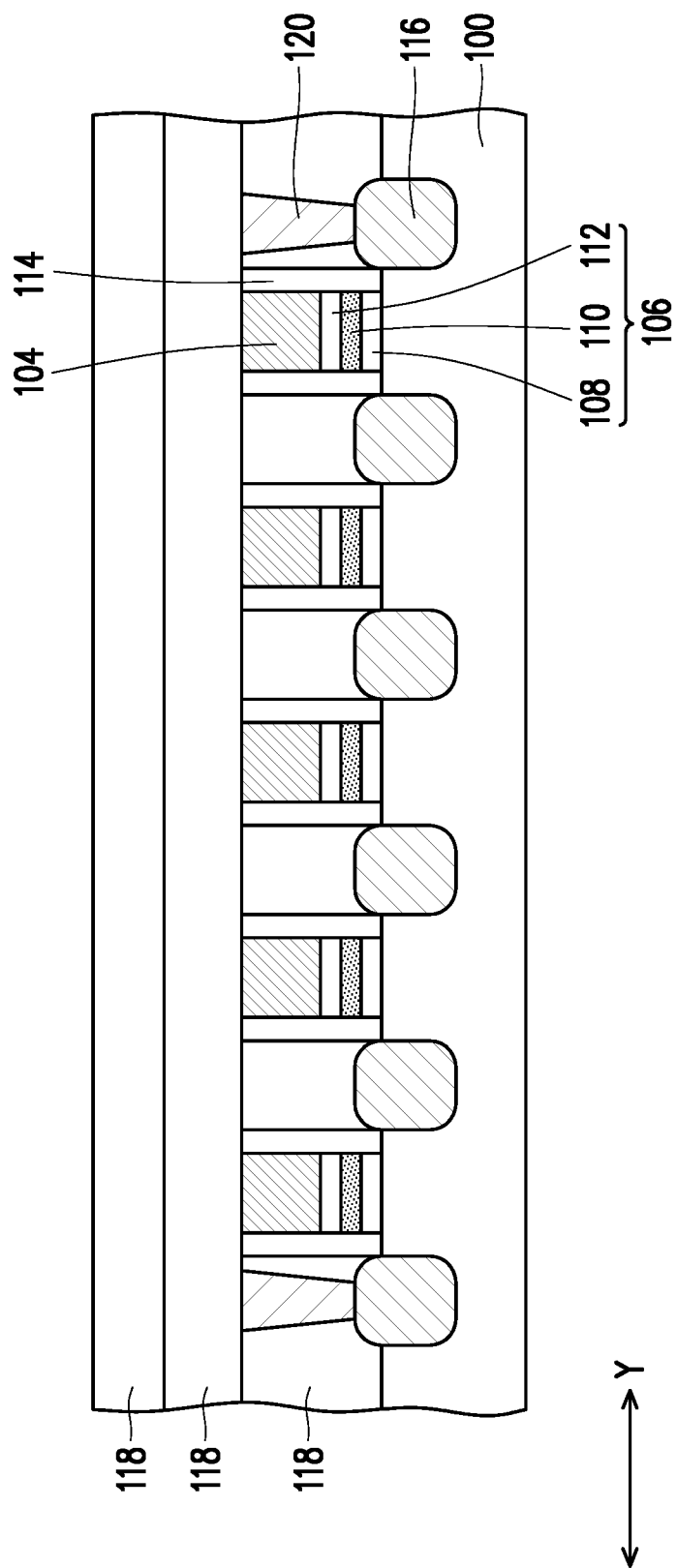

Referring to FIG. 3 and FIG. 4I, step S316 is performed, and more of the dielectric layers 118 are formed on the current structure. For instance, two more dielectric layers 118 are formed on the bottommost dielectric layer 118, and elements (e.g., including the contact plugs 120, the gate electrodes 104 and the sidewall spacers 114) laterally surrounded by the bottommost dielectric layer 118 are covered by these dielectric layers 118.

Referring to FIG. 3 and FIG. 1B, step S318 is performed, and the conductive vias 122 and the bit lines BL are formed. In some embodiments, a dual damascene process is used for forming the conductive vias 122 and the bit lines BL. In these embodiments, through holes are formed in a lower one of the two dielectric layers 118, and a trenches are formed in an upper one of the two dielectric layers 118. Subsequently, a conductive material is filled in the through holes and the trenches, and portions of the conductive material above the topmost dielectric layer 118 are removed. Remained portions of the conductive material in the through holes form the conductive vias 122, while remained portions of the conductive material in the trenches form the bit lines BL. In alternative embodiments, the conductive vias 122 and the laterally surrounding dielectric layer 118 are formed by a first damascene process, and the bit lines BL and the laterally surrounding dielectric layer 118 are formed by a second single damascene process. In these alternative embodiments, the bit lines BL and the laterally surrounding dielectric layer 118 are formed after formation of the conductive vias 122 and the laterally surrounding dielectric layer 118.

Up to here, the memory array 10 including multiple columns of the memory cells MC is formed. In addition, the memory array 10 may be subjected to further process for routing the signal lines (including the bit lines BL, the word lines WL and the selection word lines SLG) to a driving circuit (not shown) configured to manage write, read and erase operations of the memory cells MC. The driving circuit and the memory array 10 may be integrated in the same device die. Alternatively, the driving circuit and the memory array 10 are formed in separate device dies, and are interconnected as a result of a packaging process.

Figure 5:
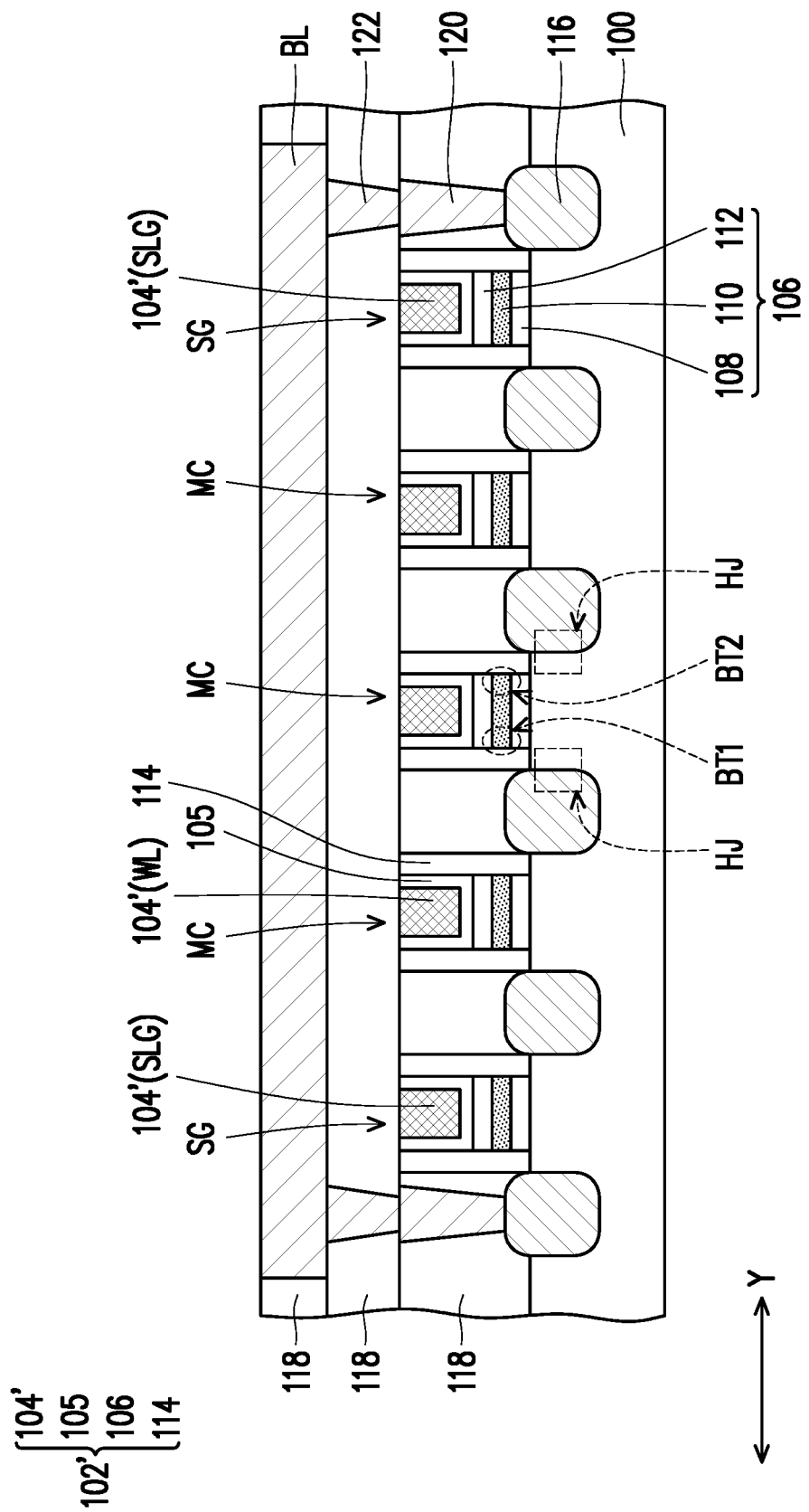
FIG. 5 is a schematic cross-sectional view illustrating structure of a column of the memory cells and the connected selection transistors in the memory array as shown in FIG. 1A, according to some embodiments of the present disclosure.

FIG. 5 is a schematic cross-sectional view illustrating structure of a column of the memory cells MC and the connected selection transistors SG in the memory array 10 as shown in FIG. 1A, according to some embodiments of the present disclosure. The memory cells MC and the selection transistors SG to be described with reference to FIG. 5 are structurally similar to the memory cells MC and the selection transistors SG described with reference to FIG. 1B. Only differences between the embodiments shown FIG. 1B and FIG. 5 will be described, the same or the like parts would not be repeated again. Further, similar elements are labeled by similar numerical references (e.g., the gate electrode 104 as shown in FIG. 1B and the gate electrode 104' to be described with reference to FIG. 5).

Referring to FIG. 5, in some embodiments, gate electrodes 104' of the memory cells MC and the selection transistors SG are formed of a metallic material, and are also referred as metal gates. For instance, the metallic material may include Al, Ti, TiN, TaN, Co, Ag, Au, Cu, Ni, Cr, Hf, Ru, W, Pt or the like. Further, in some embodiments, each of the memory cells MC and the selection transistors SG may further include an additional gate dielectric layer 105. A bottom surface and opposite sidewalls of each gate electrode 104' are covered by one of the additional gate dielectric layers 105. Portions of each additional gate dielectric layer 105 covering the sidewalls of one of the gate electrodes 104' are located between the gate electrode 104' and the sidewall spacers 114 at opposite sides of the gate electrode 104'. On the other hand, a portion of each additional gate dielectric layer 105 covering a bottom surface of one of the gate electrodes 104' is sandwiched between the gate electrode 104' and the underlying insulating layers 106. In these embodiments, the additional gate dielectric layers 105 may be formed of a high-k dielectric material (e.g., a dielectric material having dielectric constant greater than 3.9, or greater than 7 or more). For instance, the high-k dielectric material may include hafnium oxide, hafnium aluminum oxide, hafnium silicate, tantalum oxide, aluminum oxide, zirconium oxide, the like or combinations thereof.

Figure 6:
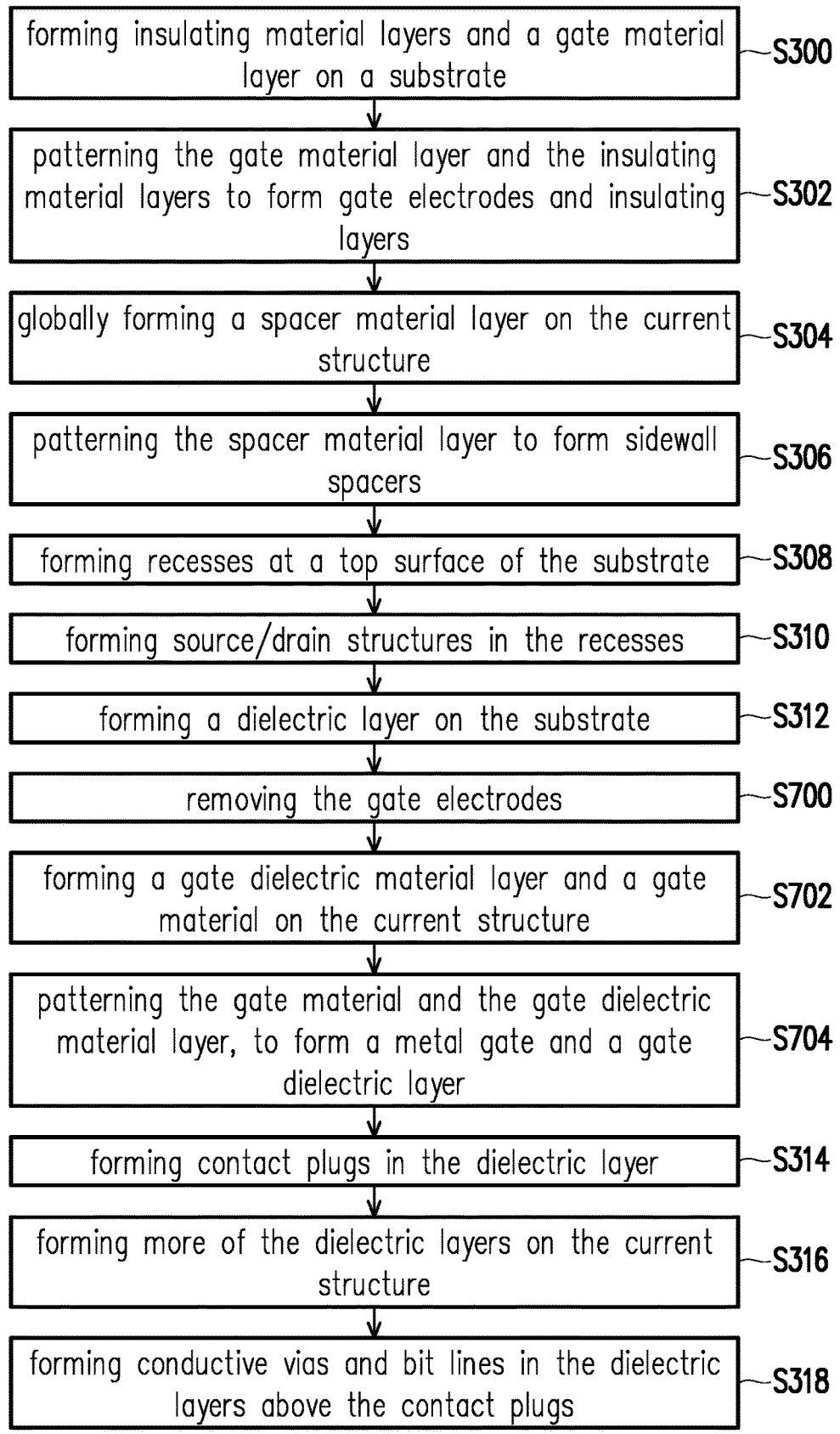
FIG. 6 is a flow diagram illustrating a manufacturing method for forming the memory array including columns of the memory cells and the connected selection transistors as shown in FIG. 5, according to some embodiments of the present disclosure.
Figure 7A:
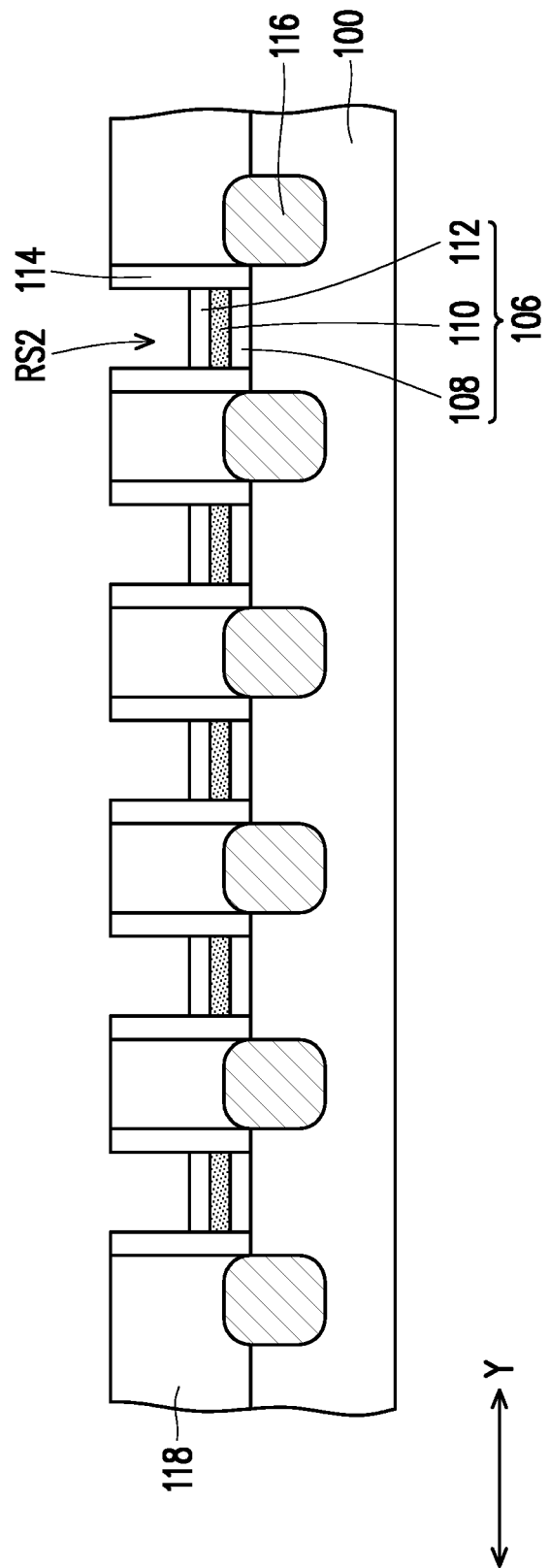
FIG. 7A through FIG. 7C are schematic cross-sectional views illustrating intermediate structures at various stages during the manufacturing process as shown in FIG. 6.
Figure 7B:
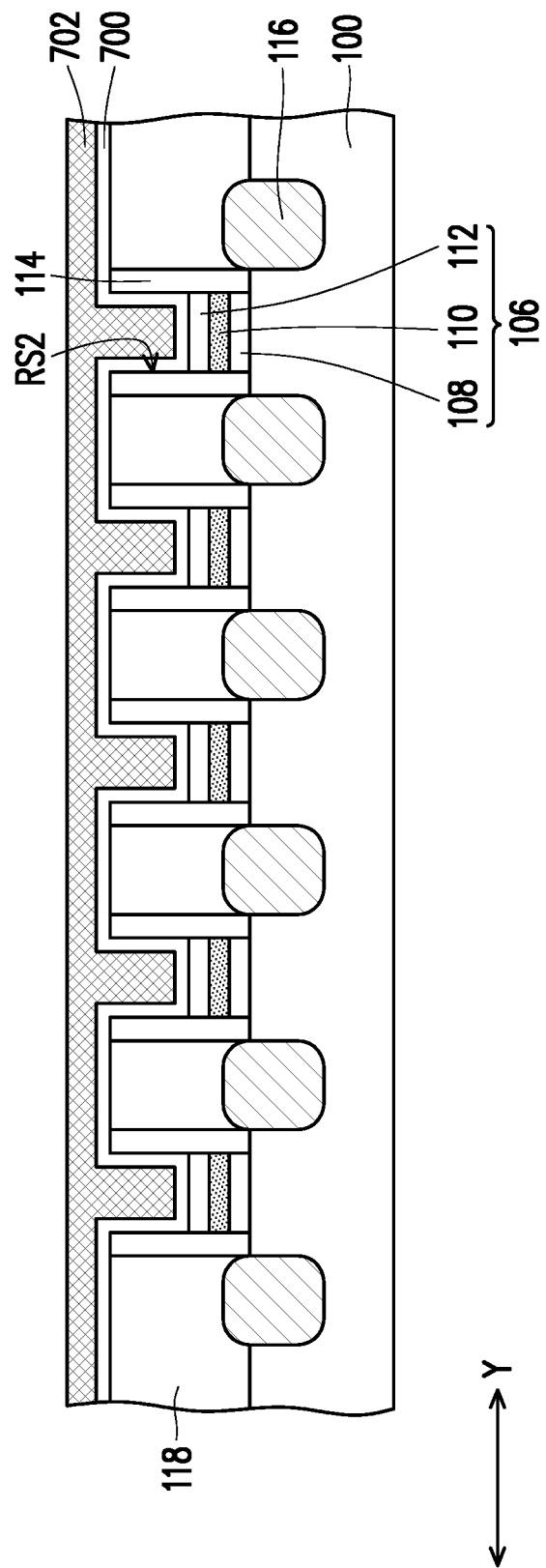
Figure 7C:
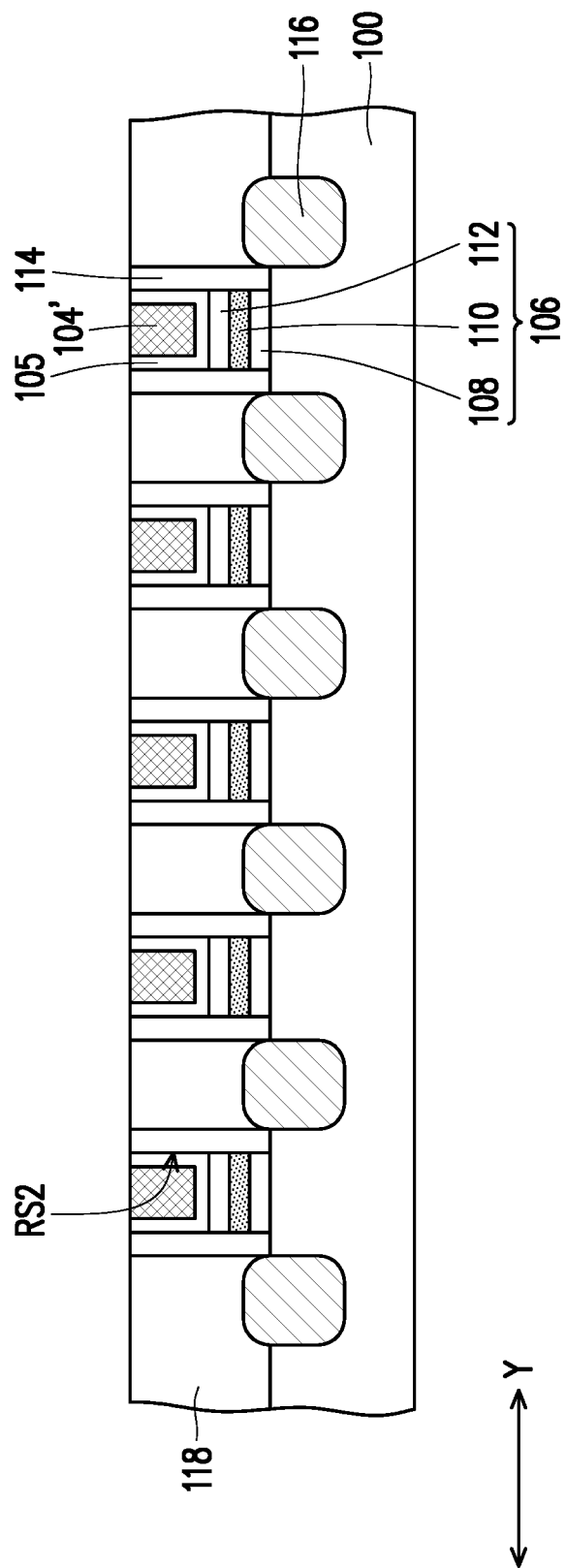

FIG. 6 is a flow diagram illustrating a manufacturing method for forming the memory array 10 including columns of the memory cells MC and the connected selection transistors SG as shown in FIG. 5, according to some embodiments of the present disclosure. FIG. 7A through FIG. 7C are schematic cross-sectional views illustrating intermediate structures at various stages during the manufacturing process as shown in FIG. 6. It should be noted that, for conciseness, formation of a single column of the memory cells MC in the memory array 10 will be used for illustrating the formation of the memory array 10.

Referring to FIG. 6, the steps S300, S302, S304, S306, S308, S310, S312 as described with reference to FIG. 3 and FIG. 4A through FIG. 4G are successively performed. Subsequently, referring to FIG. 6 and FIG. 7A, step S700 is performed, and the gate electrodes 104 are removed. Accordingly, recesses RS2 are formed in spaces previously occupied by the gate electrodes 104. In some embodiments, topmost surfaces of the insulating layers 106 may define bottom surfaces of the recesses RS2, while inner sidewalls of the sidewall spacers 114 may define sidewalls of the recesses RS2. In some embodiments, a method for removing the gate electrodes 104 includes an etching process, such as an isotropic etching process.

Referring to FIG. 6 and FIG. 7B, step S702 is performed, and a gate dielectric material layer 700 and a gate material 702 are successively formed on the current structure. The gate dielectric material layer 700 conformally covers a top surface of the dielectric layer 118, as well as the bottom surfaces and the sidewalls of the recesses RS2. The gate material 702 covers the additional dielectric material layer 700, and fills up the recesses RS2. In the following step, the gate dielectric material layer 700 will be patterned to form the additional gate dielectric layers 105 as described with reference to FIG. 5, while the gate material 702 will be patterned to form the gate electrodes 104' (i.e., the metal gates) as described with reference to FIG. 5.

Referring to FIG. 6 and FIG. 7C, step S704 is performed, and the gate material 702 as well as the gate dielectric material layer 700 are patterned. Portions of the gate material 702 above the dielectric layer 118 are removed, and remained portions of the gate material 702 in the recesses RS2 form the gate electrodes 104'. In addition, portions of the gate dielectric material layer 700 above the dielectric layer 118 are removed, while remained portions of the gate dielectric material layer 700 in the recesses RS2 form the gate dielectric layers 105.

Up to here, the gate electrodes 104 have been replaced by the gate electrodes 104' (i.e., the metal gates), and such gate replacement is performed after formation of the source/drain structures 116. Alternatively, the gate replacement may be performed before the formation of the source/drain structures 116. Either way, after the gate replacement and formation of the source/drain structures 116 as well as the dielectric layer 118, steps S314, S316, S318 are successively performed, to form the structure as shown in FIG. 5.

Figure 8A:
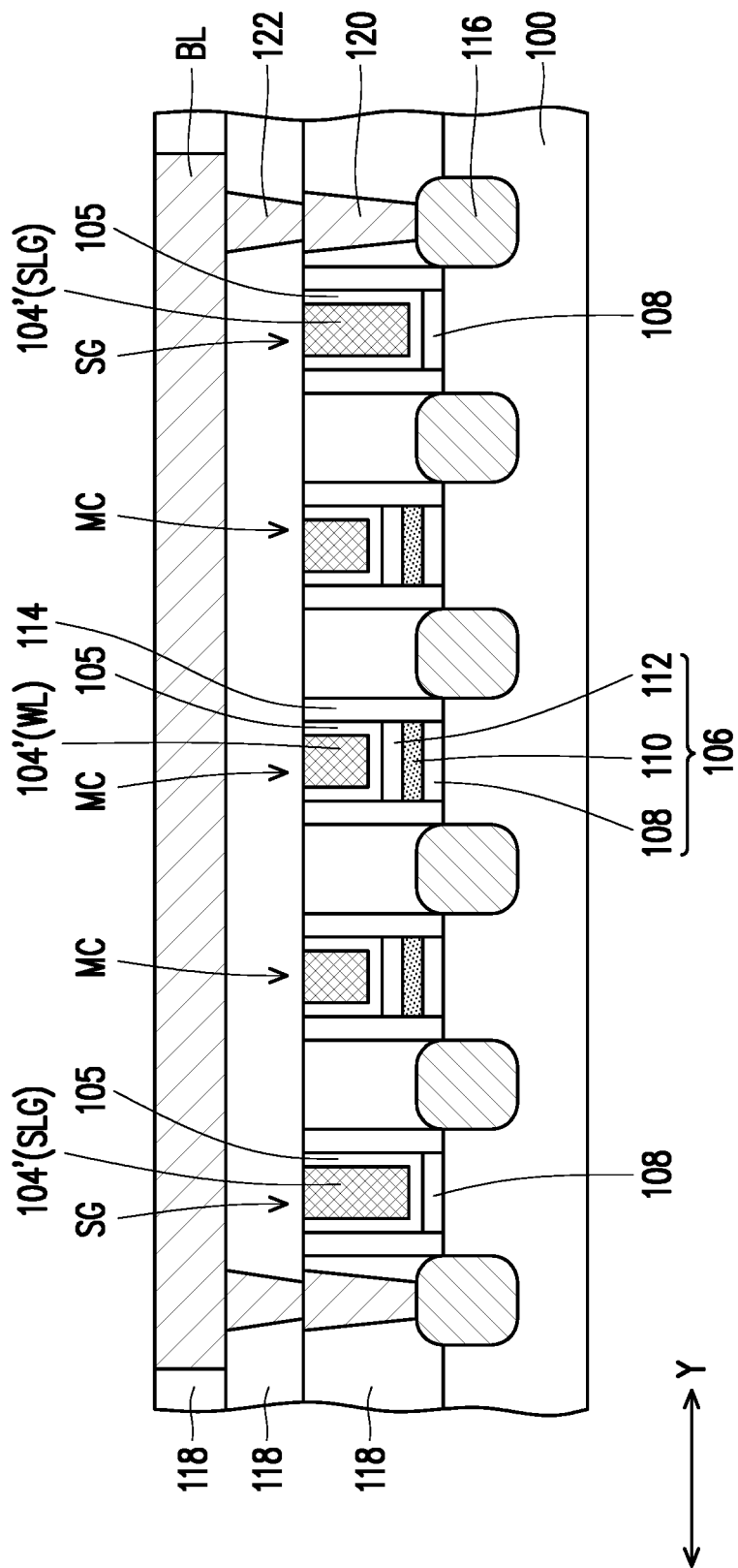
FIG. 8A is a schematic cross-sectional view illustrating structure of a column of the memory cells and connected selection transistors in the memory array as shown in FIG. 1A, according to some embodiments of the present disclosure.

FIG. 8A is a schematic cross-sectional view illustrating structure of a column of the memory cells MC and connected selection transistors SG in the memory array 10 as shown in FIG. 1A, according to some embodiments of the present disclosure. The memory cells MC shown in FIG. 8A are substantially identical with the memory cells MC as described with reference to FIG. 5, while the selection transistors SG as shown in FIG. 8A are structurally different from the memory cells MC. Differences between the selection transistors SG and the memory cells MC will be described, whereas the same or the like parts would not be repeated again.

Referring to FIG. 8A, in some embodiments, the selection transistors SG are different from the memory cells MC mainly in that at least the charge trapping layers 110 are omitted from the selection transistors SG, thus can be prevented from being accidentally programmed. In these embodiments, the selection transistors SG could be regarded as being formed of normal field effect transistors (e.g., normal planar-type field effect transistors), rather than flash transistors. Further, in addition to the charge trapping layers 110, other layers of the insulating layers 106 may be omitted from the selection transistors SG as well. For instance, the charge trapping layers 110 and the gate dielectric layers 112 may be omitted from the selection transistors SG. Correspondingly, the gate electrodes 104' of the selection transistors SG may extend (downwardly) to a depth greater than a depth to which the gate electrodes 104' of the memory cells MC extend (downwardly). Similarly, the gate dielectric layers 105' of the selection transistors SG may extend (downwardly) to a depth greater than a depth to which the gate dielectric layers 105' of the memory cells MC extend (downwardly).

Figure 8B:
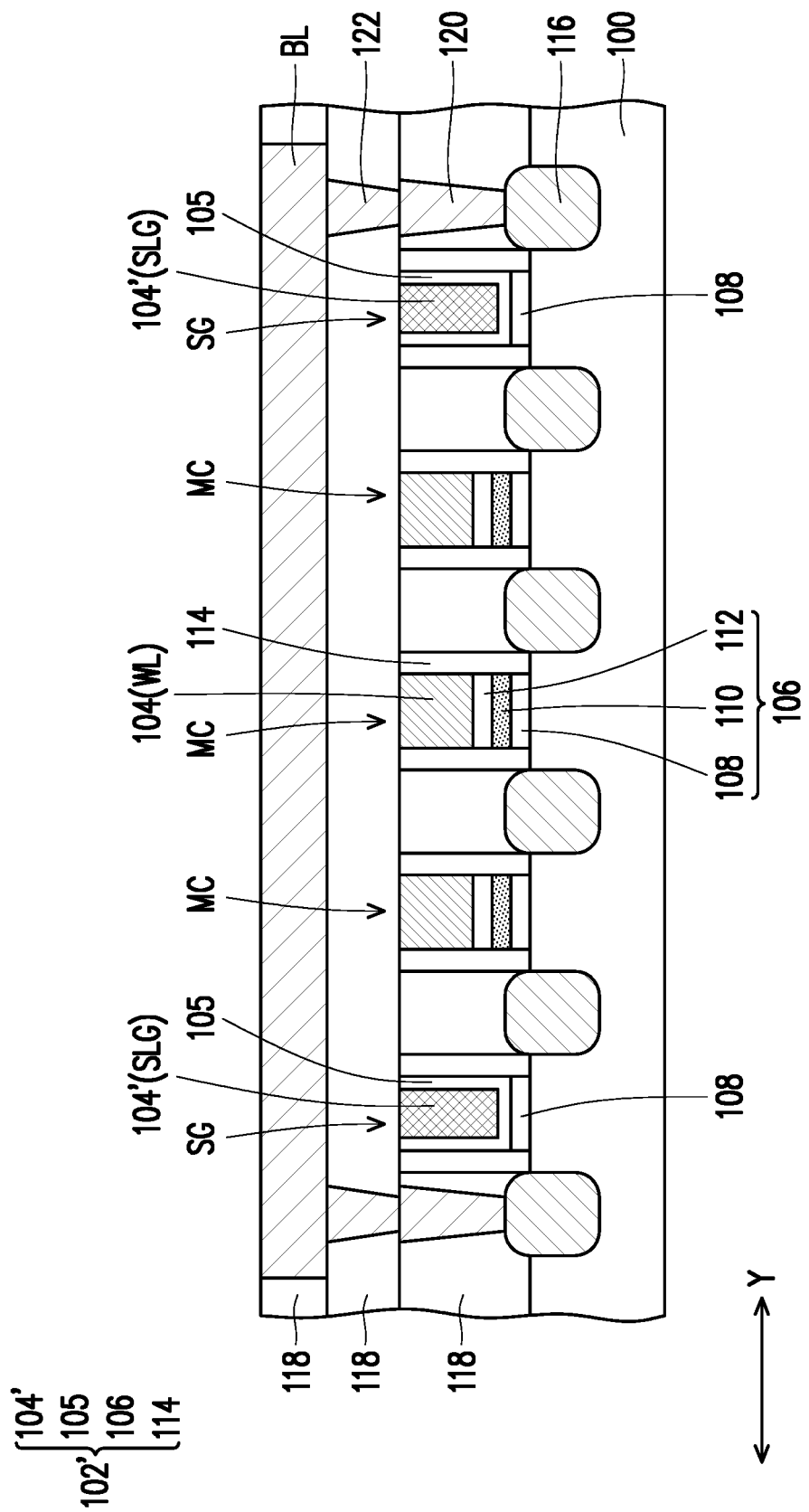
FIG. 8B is a schematic cross-sectional view illustrating structure of a column of the memory cells and connected selection transistors in the memory array as shown in FIG. 1A, according to some embodiments of the present disclosure.

FIG. 8B is a schematic cross-sectional view illustrating structure of a column of the memory cells MC and connected selection transistors SG in the memory array 10 as shown in FIG. 1A, according to some embodiments of the present disclosure.

The memory cells MC shown in FIG. 8B are substantially identical with the memory cells MC as described with reference to FIG. 1B, while the selection transistors SG as shown in FIG. 8B are substantially identical with the selection transistors SG as shown in FIG. 8A. In other words, in those embodiments shown in FIG. 8B, the gate electrodes 104 are functioned as gate terminals of the memory cells MC, while the gate electrodes 104' are functioned as gate terminals of the selection transistors SG. In addition, in these embodiments, sidewalls and bottom surfaces of the gate electrodes 104' in the selection transistors SG are further covered by the gate dielectric layers 105, and at least the charge trapping layers 110 of the insulating layers 106 may be omitted from the selection transistors SG.

Figure 9:
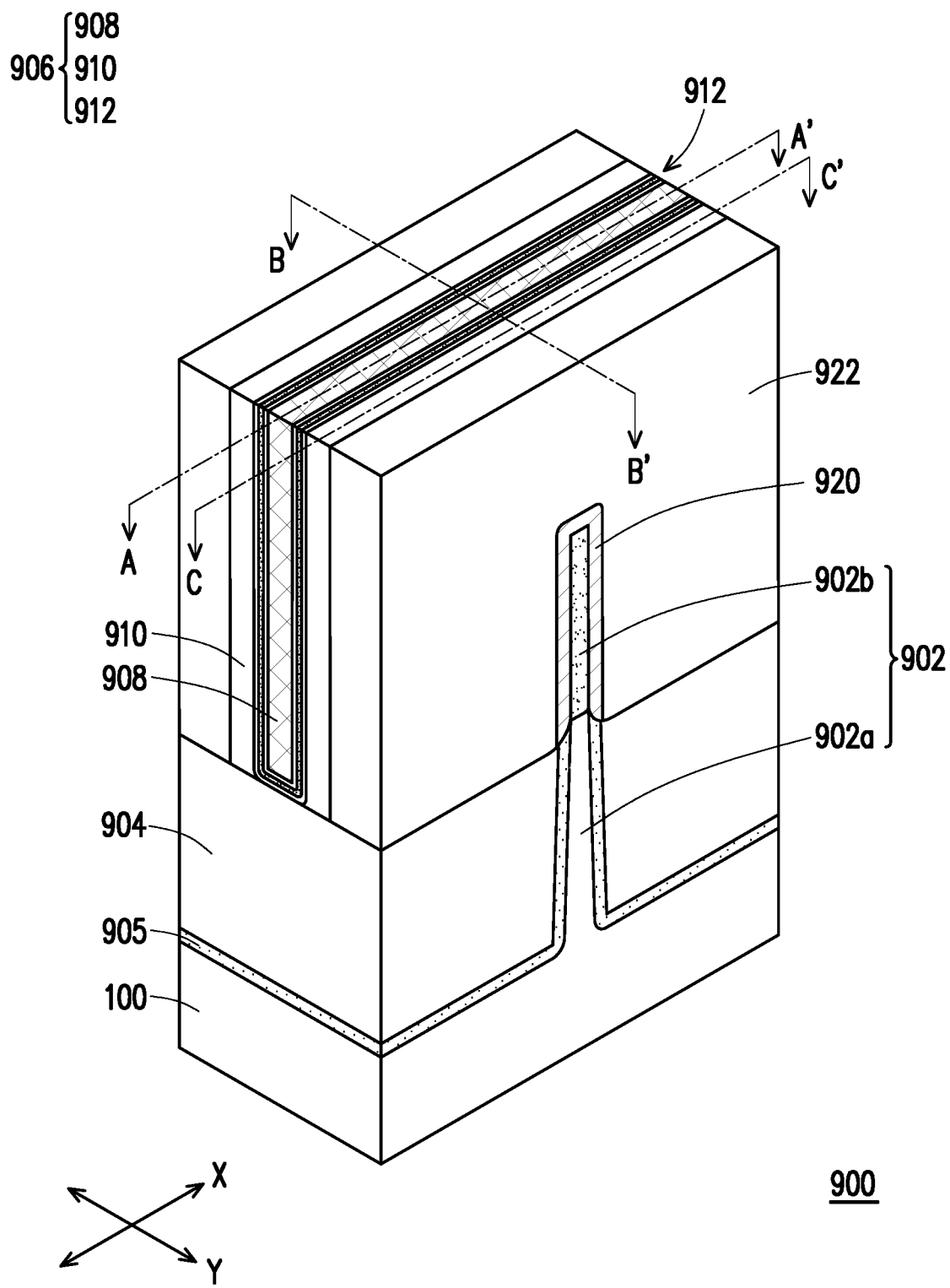
FIG. 9 is a schematic three-dimensional view illustrating a transistor of a memory cell or a selection transistor of the memory array as shown in FIG. 1A, according to some embodiments of the present disclosure.
Figure 10A:
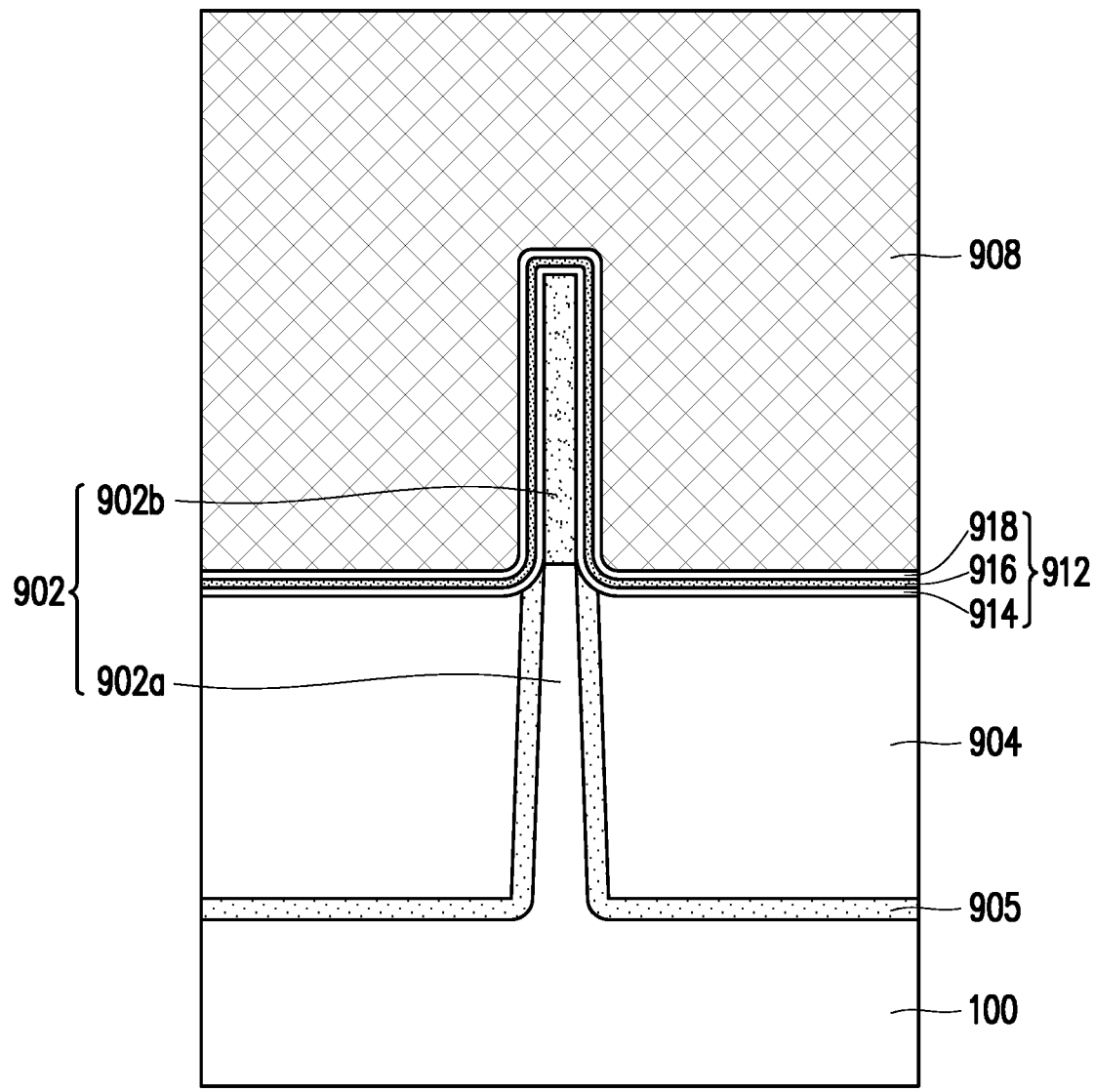
FIG. 10A is a schematic cross-sectional view along a line A-A' as shown in FIG. 9.
Figure 10B:
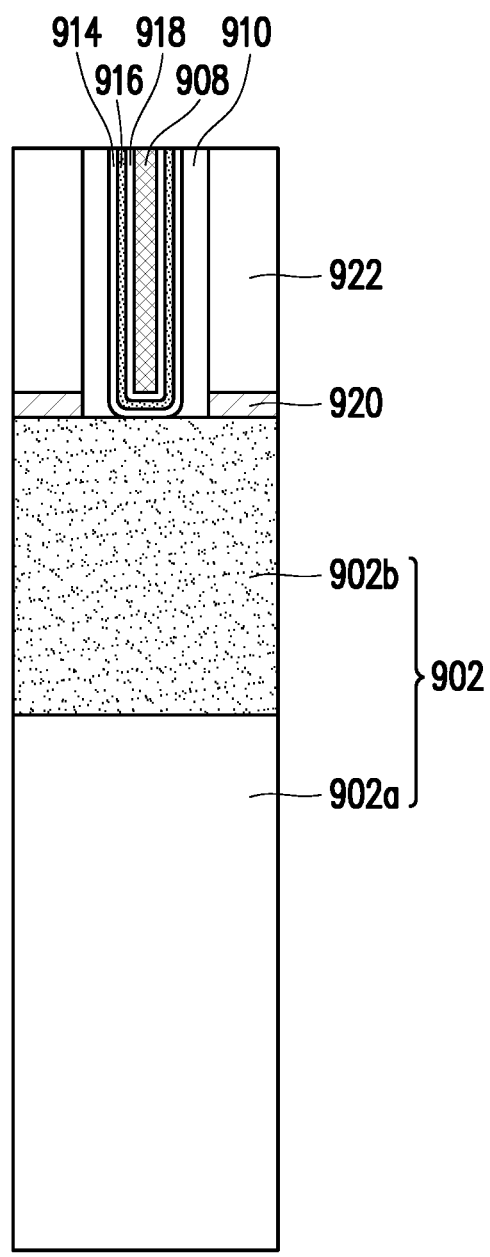
FIG. 10B is a schematic cross-sectional view along a line B-B' as shown in FIG. 9.
Figure 10C:
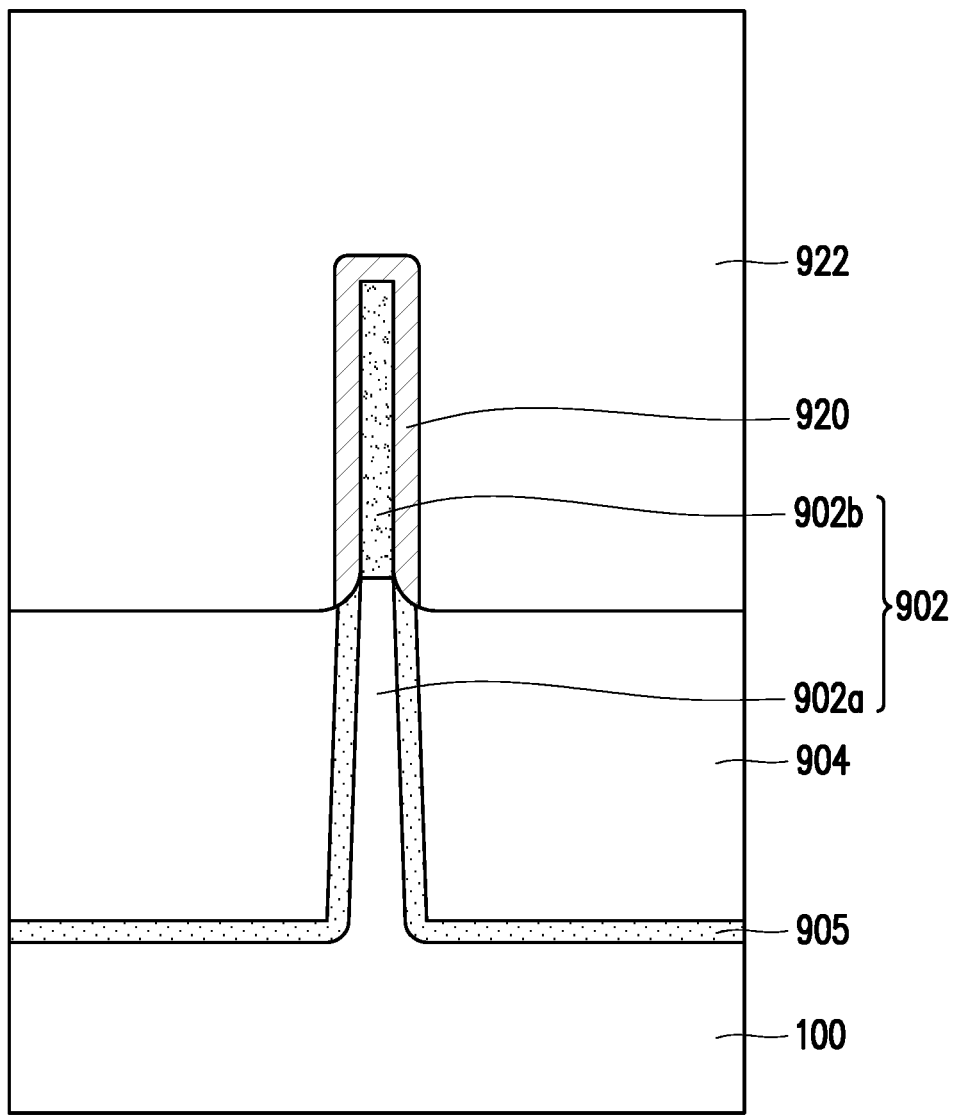
FIG. 10C is a schematic cross-sectional view along a line C-C' as shown in FIG. 9.

FIG. 9 is a schematic three-dimensional view illustrating a transistor of a memory cell MC or a selection transistor SG of the memory array 10 as shown in FIG. 1A, according to some embodiments of the present disclosure. FIG. 10A is a schematic cross-sectional view along a line A-A' as shown in FIG. 9. FIG. 10B is a schematic cross-sectional view along a line B-B' as shown in FIG. 9. FIG. 10C is a schematic cross-sectional view along a line C-C' as shown in FIG. 9.

Referring to FIG. 9 and FIG. 10A through FIG. 10C, in some embodiments, each of the memory cells MC and the selection transistors SG is formed of a fin-type flash transistor 900. A fin structure 902 is functioned as a channel structure in the fin-type flash transistor 900. The fin structure 902 is protruded from a flat portion of the substrate 100 along a vertical direction, and may laterally extend along the direction Y. In some embodiments, a lower portion 902a of the fin structure 902 is a fin portion of the substrate 100 standing on the flat portion of the substrate 100, and an upper portion 902b of the fin structure 902 is an epitaxial structure. The upper portion 902b of the fin structure 902 may be formed as a wall structure standing on the fin portion of the substrate 100 (i.e., the lower portion 902a of the fin structure 902), and may have a width less than, equal to or greater than a width of the fin portion of the substrate 100 (i.e., the lower portion 902a of the fin structure 902). In some embodiments, the upper portion 902b is formed of a semiconductor material different from a semiconductor material of the substrate 100. For instance, the substrate 100 may be a silicon wafer or a silicon-on-insulator wafer, while the upper portion 902b of the fin structure 902 may be formed of SiGe.

In some embodiments, an isolation structure 904 is disposed on the flat portion of the substrate 100, and covers opposite sidewalls of the lower portion 902a of the fin structure 902. Further, in some embodiments, a liner layer 905 is disposed between the substrate 100 and the isolation structure 904, and conformally covers the flat portion of the substrate 100 as well as the opposite sidewalls of the fin portion of the substrate 100 (i.e., the lower portion 902a of the fin structure 902). On the other hand, the upper portion 902b of the fin structure 902 may protrude from the isolation structure 904 along the vertical direction, and may not be covered by the liner layer 905 nor the isolation structure 904. The isolation structure 904 and the liner layer 905 are respectively formed of an insulating material, such as silicon oxide, silicon nitride, silicon oxynitride, silicon carbonitride, silicon oxycarbide, the like or combinations thereof.

The fin structure 902 is covered by and intersected with a gate structure 906. In some embodiments, the gate structure 906 stands on the isolation structure 904, and covers and intersects with the upper portion 902b of the fin structure 902. In those embodiments where the fin structure 902 laterally extends along the direction Y, the gate structure 906 may laterally extend along the direction X. Further, in some embodiments, the gate structure 906 includes a gate electrode 908 and sidewall spacers 910 covering opposite sidewalls of the gate electrode 908. The gate electrode 908 is a section of one of the word lines WL as described with reference to FIG. 1A, and is functioned as a gate terminal of the fin-type flash transistor 900. The sidewall spacers 910 electrically isolate the gate electrode 908 from other terminals of the fin-type flash transistor 900 (e.g., source/drain terminals of the fin-type flash transistor 900). In some embodiments, the gate electrode 908 may be formed of polysilicon or a metallic material, while the sidewall spacers 910 may be formed of an insulating material. For instance, the metallic material may include Al, Ti, TiN, TaN, Co, Ag, Au, Cu, Ni, Cr, Hf, Ru, W, Pt or the like, and the insulating material may include silicon oxide, silicon nitride, silicon oxynitride, the like or combinations thereof.

Referring to FIG. 9, FIG. 10A and FIG. 10B, the gate structure 906 further includes insulating layers 912. The insulating layers 912 are formed between the gate electrode 908 and the fin structure 902, and may cover inner sidewalls of the sidewall spacers 910 (as shown in FIG. 10B). The insulating layers 912 may be similar to the insulating layers 106 as described with reference to FIG. 1B, and also include a tunneling layer 914, a charge trapping layer 916 and a gate dielectric layer 918. The fin structure 902 may be in contact with the charge trapping layer 916 through the tunneling layer 914, and the charge trapping layer 916 may be separated from the gate electrode 908 by the gate dielectric layer 918. In some embodiments, the tunneling layer 914 and the gate dielectric layer 918 are formed of silicon oxide, while the charge trapping layer 916 is formed of silicon nitride. In these embodiments, the insulating layers 912 could be regarded as a silicon oxide-silicon nitride-silicon oxide (ONO) multilayer structure. In certain embodiments, an additional charge trapping layer and an additional gate dielectric layer are further disposed between the gate dielectric layer 918 and the gate electrode 908, and the additional charge trapping layer is sandwiched between the gate dielectric layers (including the gate dielectric layer 918 and the additional gate dielectric layer).

Referring to FIG. 9, FIG. 10B and FIG. 10C, source/drain structures 920 are disposed on the fin structure 902 at opposite sides of the gate structure 906. The source/drain structures 920 are functioned as source and drain terminals of the fin-type flash transistor 900, and may be isolated from the gate electrode 908 by the sidewall spacers 910. In some embodiments, regions of the upper portion 902b of the fin structure 902 at the opposite sides of the gate structure 906 are covered by the source/drain structures 920. The source/drain structures 920 are formed of a material having a bandgap different from a bandgap of a material of the fin structure 902 (e.g., a material of the upper portion 902b of the fin structure 902), thus the heterojunctions HJ (as described with reference to FIG. 1B) are formed at interfaces between the source/drain structures 920 and the fin structure 902, for increasing the BTB tunneling current (as described with reference to FIG. 1B) flowing through these interfaces. In some embodiments, the material of the source/drain structures 920 includes SiGe, Ge, GeSn, GaAs, GaN, SiC the like or combinations thereof. In certain embodiments where the upper portion 902b of the fin structure 902 and the source/drain structures 920 are formed of the same material (e.g., SiGe), an elemental concentration in the material of the upper portion 902b of the fin structure 902 (e.g., Ge concentration in SiGe) is higher or lower than the elemental concentration in the material of the source/drain structures 920, such that the bandgap of the material of the upper portion 902b of the fin structure 902 can still be different from the bandgap of the material of the source/drain structures 920, and the heterojunctions HJ can still be formed.

In some embodiments, the source/drain structures 920 are covered by a dielectric layer 922. In those embodiments where the source/drain structures 920 cover the upper portion 902b of the fin structure 902, the upper portion 902b of the fin structure 902 as well as the source/drain structures 920 may be embedded in the dielectric layer 922. Further, the dielectric layer 922 may be disposed on the isolation structure 904, and may be in lateral contact with the gate structure 906 (e.g., the sidewall spacers 910 of the gate structure 906) from opposite sides of the gate structure 906. In some embodiments, a top surface of the dielectric layer 922 is substantially coplanar with a top surface of the gate structure 906.

The fin-type flash transistor 900 is operationally similar to the planar-type flash transistor as described with reference to FIG. 1B, except that the fin-type flash transistor 900 may have better electrostatic gate control due to larger coupling area between gate terminal and channel region. In addition, the fin structure 902 may continuously extend through a plurality of the fin-type flash transistors 900 that are functioned as a column of the memory cells MC and the connected selection transistors SG and in serial connection with one another (as described with reference to FIG. 1A). Moreover, as similar to the planar-type flash transistors as described with reference to FIG. 1B, a bit line BL is coupled to the selection transistors SG connected to both ends of a column of the memory cells MC by conductive elements similar to the contact plugs 120 and the conductive vias 122 as described with reference to FIG. 1B. Further, as similar to the embodiments described with reference to FIG. 8A and FIG. 8B, at least the charge trapping layers 916 may be omitted from the selection transistors SG.

Figure 11:
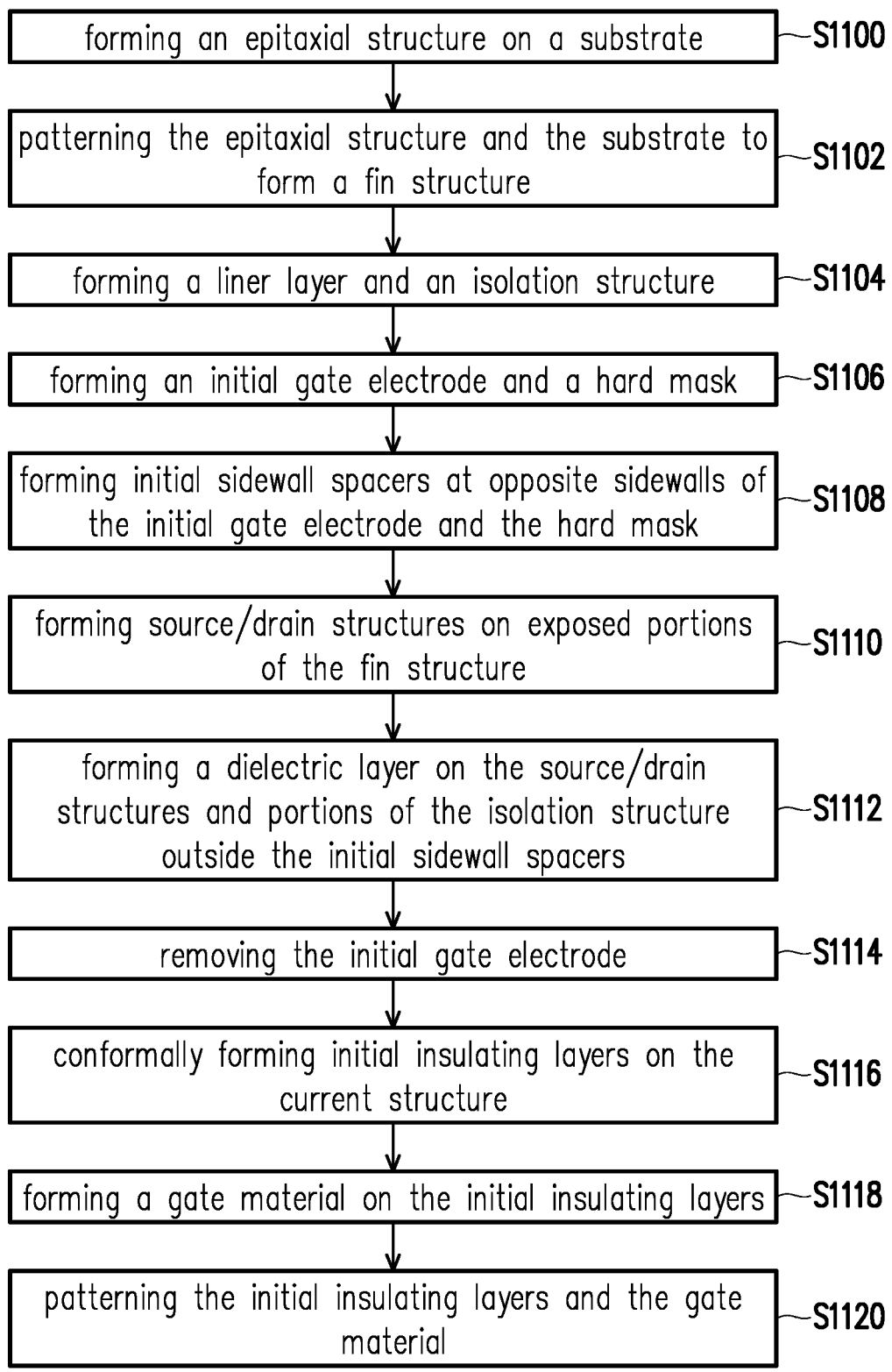
FIG. 11 is a flow diagram illustrating a manufacturing method for forming the fin-type flash transistor as shown in FIG. 9 and FIG. 10A through FIG. 10C, according to some embodiments of the present disclosure.

FIG. 11 is a flow diagram illustrating a manufacturing method for forming the fin-type flash transistor 900 as shown in FIG. 9 and FIG. 10A through FIG. 10C, according to some embodiments of the present disclosure. FIG. 12A through FIG. 12J are schematic three-dimensional views illustrating intermediate structures at various stages during formation of the fin-type flash transistor 900 by using the manufacturing method shown in FIG. 11.

Figure 12A:
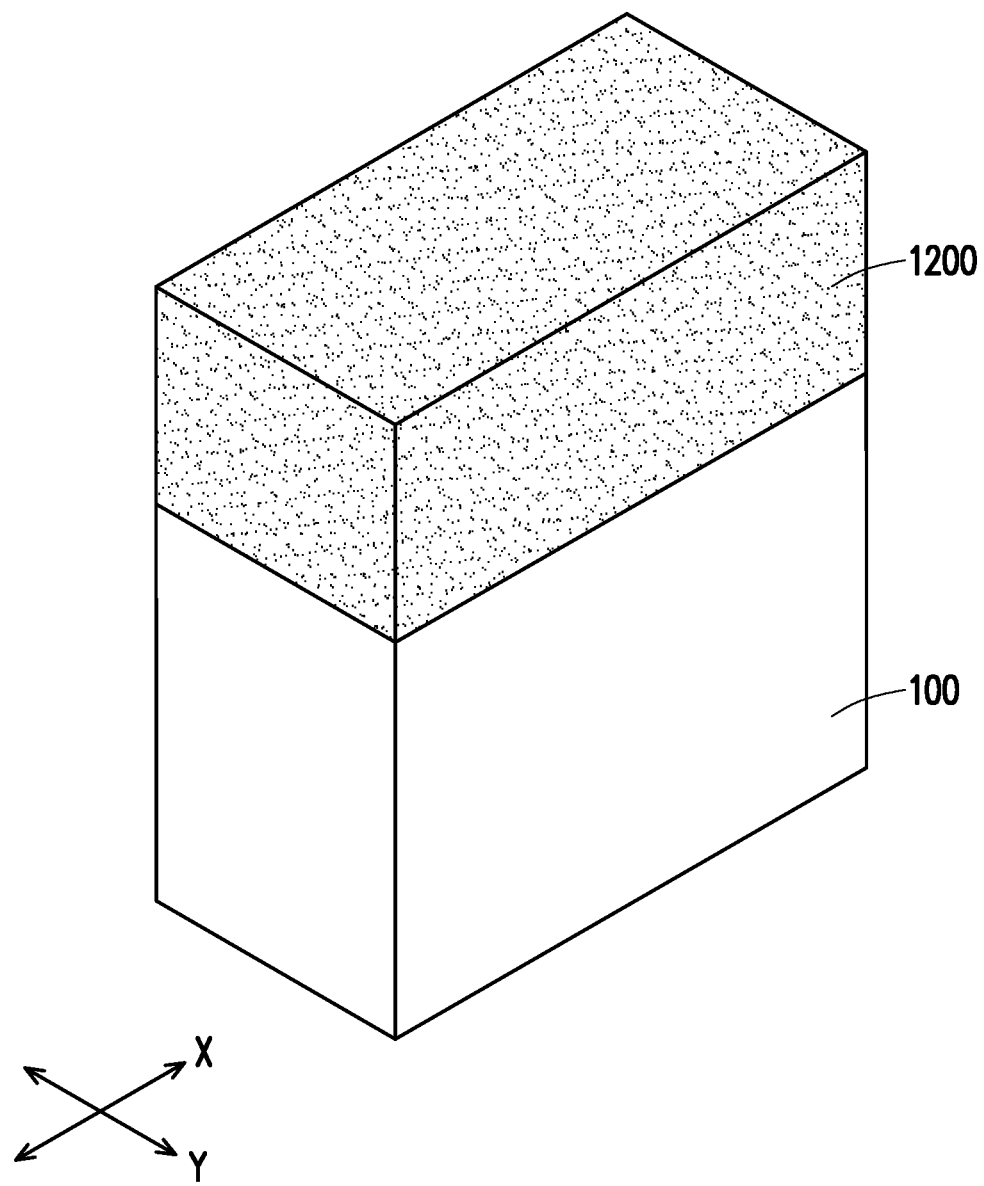
FIG. 12A through FIG. 12J are schematic three-dimensional views illustrating intermediate structures at various stages during formation of the fin-type flash transistor by using the manufacturing method shown in FIG. 11.

Referring to FIG. 11 and FIG. 12A, step S1100 is performed, and an epitaxial structure 1200 is formed on the substrate 100. The epitaxial structure 1200 will be patterned to form the upper portion 902b of the fin structure 902 as described with reference to FIG. 9 and FIG. 10A through FIG. 10C. An epitaxial process may be used for forming the epitaxial structure 1200.

Figure 12B:
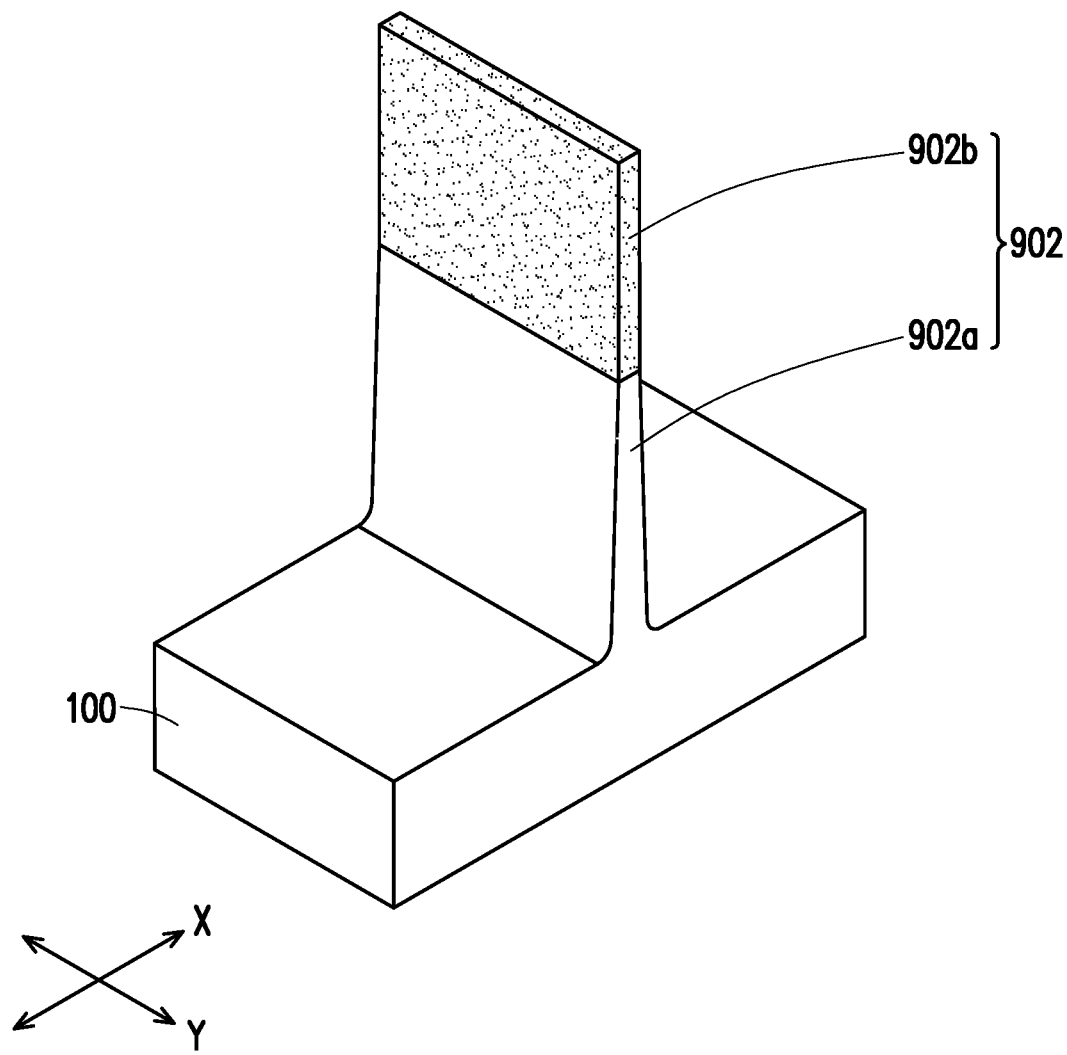

Referring to FIG. 11 and FIG. 12B, step S1102 is performed, and the epitaxial structure 1200 as well as the substrate 100 are patterned to form the fin structure 902. The epitaxial structure 1200 is shaped to form the upper portion 902b of the fin structure 902, and the substrate 100 is patterned to form the lower portion 902a of the fin structure 902. A method for patterning the epitaxial structure 1200 and the substrate 100 may include a lithography process and one or more etching process(es). In some embodiments, a self-aligned double patterning (SADP) or a self-aligned quadruple patterning (SAQP) is used while patterning the epitaxial structure 1200 and the substrate 100 for forming the fin structure 902.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 12C:
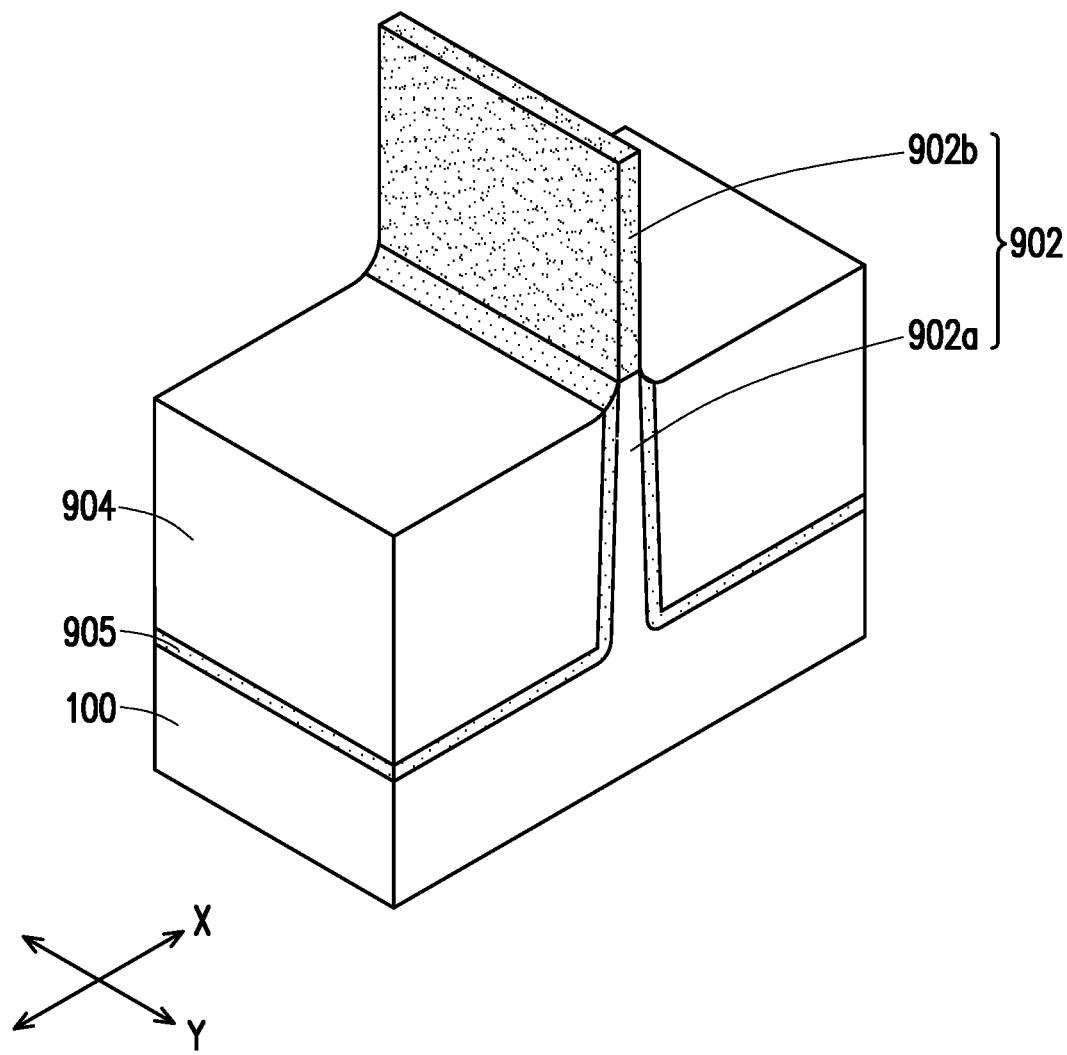

Referring to FIG. 11 and FIG. 12C, step S1104 is performed, and the liner layer 905 as well as the isolation structure 904 are formed. In some embodiments, a method for forming the liner layer 905 and the isolation structure 904 includes forming a liner material layer globally and conformally covering the structure as shown in FIG. 12B, then disposing an insulating material at opposite sides of the fin structure 902. Subsequently, upper portions of the liner material layer and the insulating material are removed. Remained portions of the liner material layer form the liner layer 905, while remained portions of the insulating material form the isolation structure 904.

Figure 12D:
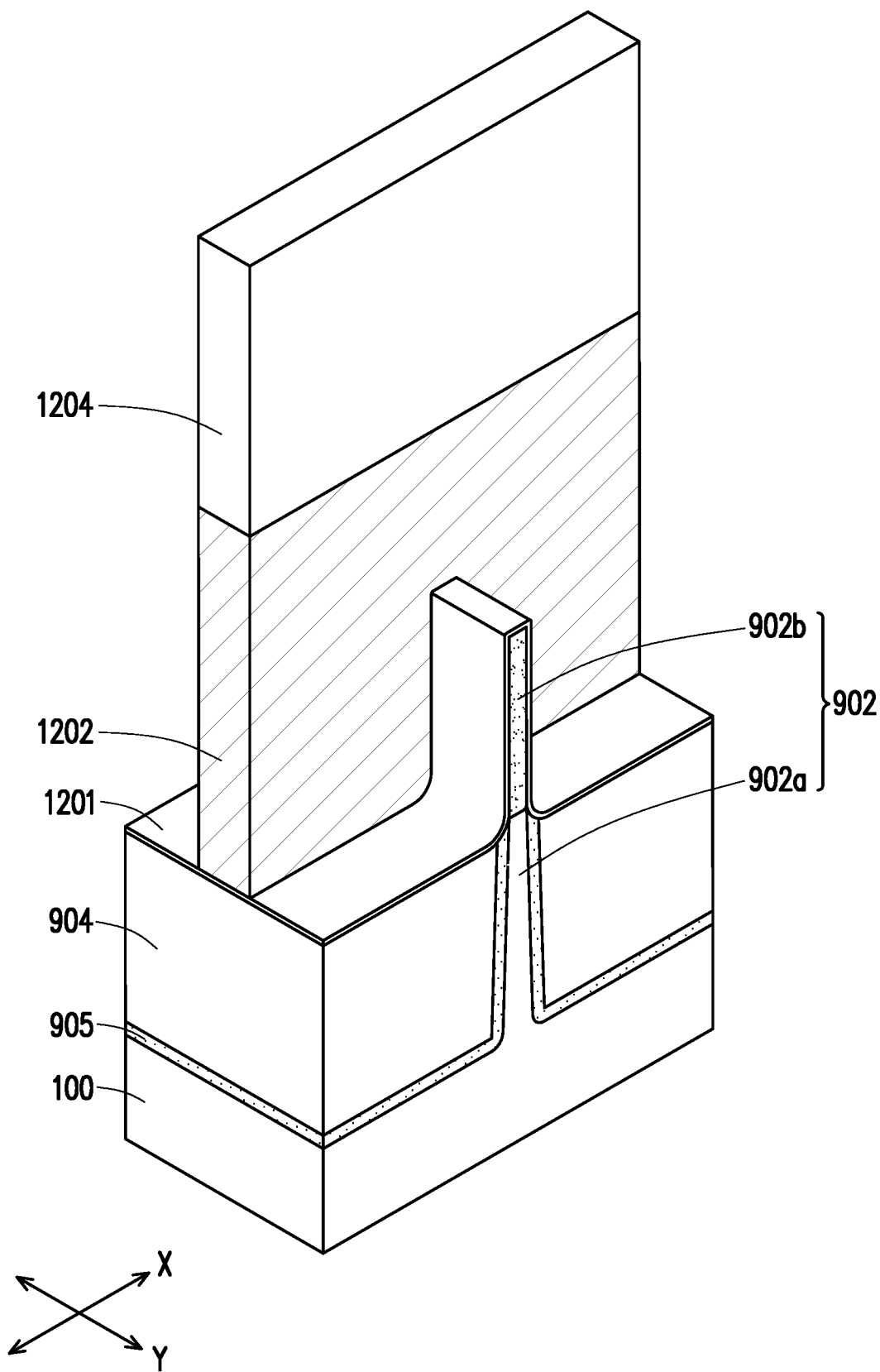

Referring to FIG. 11 and FIG. 12D, step S1106 is performed, and an initial gate electrode 1202 as well as a hard mask 1204 are formed. The initial gate electrode 1202 will be replaced by the gate electrode 908 as described with reference to FIG. 9 and FIG. 10A through FIG. 10C, and the hard mask 1204 may be removed in the following steps. In some embodiments, the initial gate electrode 1202 is formed of polysilicon, while the hard mask 1204 is formed of a material (e.g., silicon oxide, silicon nitride, silicon oxynitride, the like or combinations thereof) having sufficient etching selectivity with respect to polysilicon. In some embodiments, a method for forming the initial gate electrode 1202 and the hard mask 1204 includes globally forming an initial gate layer and a mask layer on the structure as shown in FIG. 12C. Subsequently, the mask layer is patterned by using a lithography process and an etching process, to form the hard mask 1204. Afterwards, the initial gate layer is patterned by an etching process using the hard mask 1204 as a shadow mask, to form the initial gate electrode 1202.

In some embodiments, before formation of the initial gate electrode 1202 and the hard mask 1204, a capping layer 1201 is globally and conformally formed on the structure as shown in FIG. 12C. Thereby, the subsequently formed initial gate electrode 1202 is in contact with the fin structure 902 and the isolation structure 904 through the capping layer 1201. In addition, the capping layer 1201 may be at least partially removed during formation of the sidewall spacers 910 and replacement of the initial gate electrode 1202 in the following steps. The capping layer 1201 may be formed of an insulating material, such as silicon oxide, silicon nitride, silicon oxynitride, the like or combinations thereof.

Figure 12E:
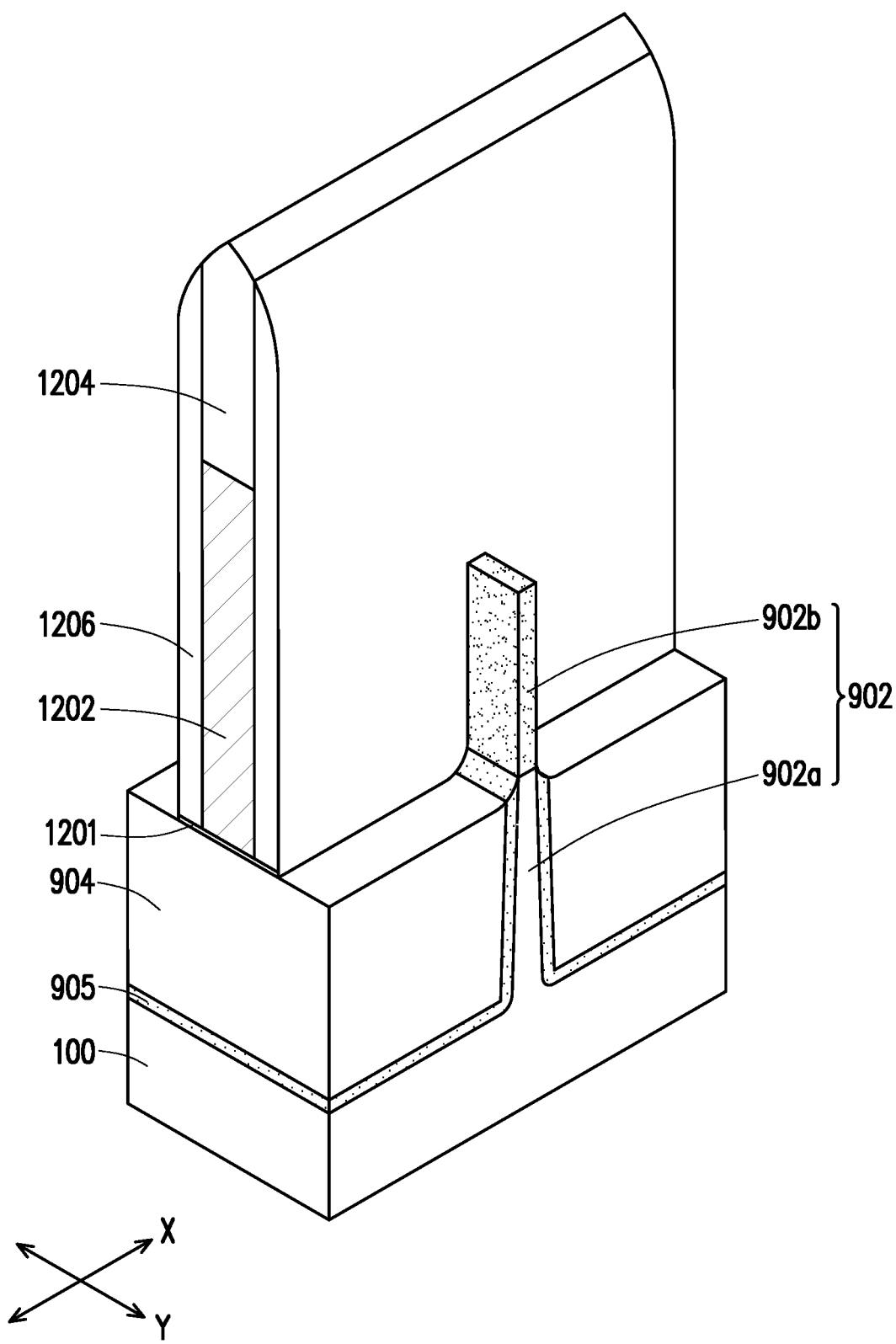

Referring to FIG. 11 and FIG. 12E, step S1108 is performed, and initial sidewall spacers 1206 are formed at opposite sidewalls of the initial gate electrode 1202 and the hard mask 1204. In the following steps, the initial sidewall spacers 1206 may be shortened to form the sidewall spacers 910 as described with reference to FIG. 9. In some embodiments, a method for forming the initial sidewall spacers 1206 includes forming a spacer material layer globally and conformally covering the structure as shown in FIG. 12D. Subsequently, an etching process (e.g., an anisotropic etching process) may be performed on the spacer material layer, to pattern the spacer material layer for forming the initial sidewall spacers 1206. In some embodiments, portions of the capping layer 1201 not covered by the initial gate electrode 1202 and the initial sidewall spacers 1206 are removed during formation of the initial sidewall spacers 1206. In these embodiments, portions of the fin structure 902 and the isolation structure 904 outside the initial sidewall spacers 1206 may be currently exposed. Further, during the etching process, the hard mask 1204 may be shaped as having a tapered top portion.

Figure 12F:
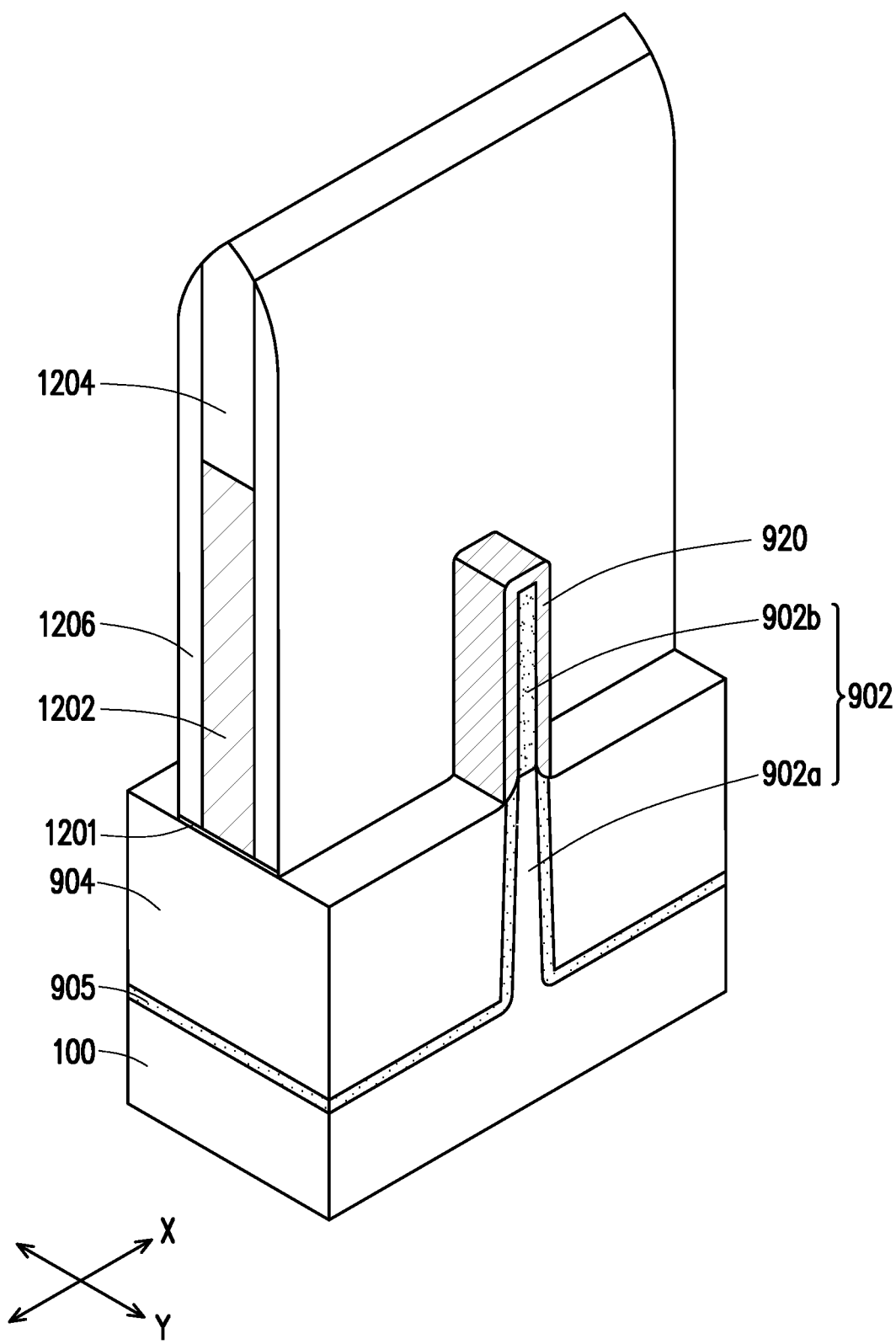

Referring to FIG. 11 and FIG. 12F, step S1110 is performed, and the source/drain structures 920 are formed on the exposed portions of the fin structure 902. In some embodiments, an epitaxial process is used for forming the source/drain structures 920. The source/drain structures 920 may be selectively formed on the fin structure 902 during the epitaxial process. Further, in some embodiments, the exposed portions of the fin structure 902 may be slightly recessed by an etching process before formation of the source/drain structures 920.

Figure 12G:
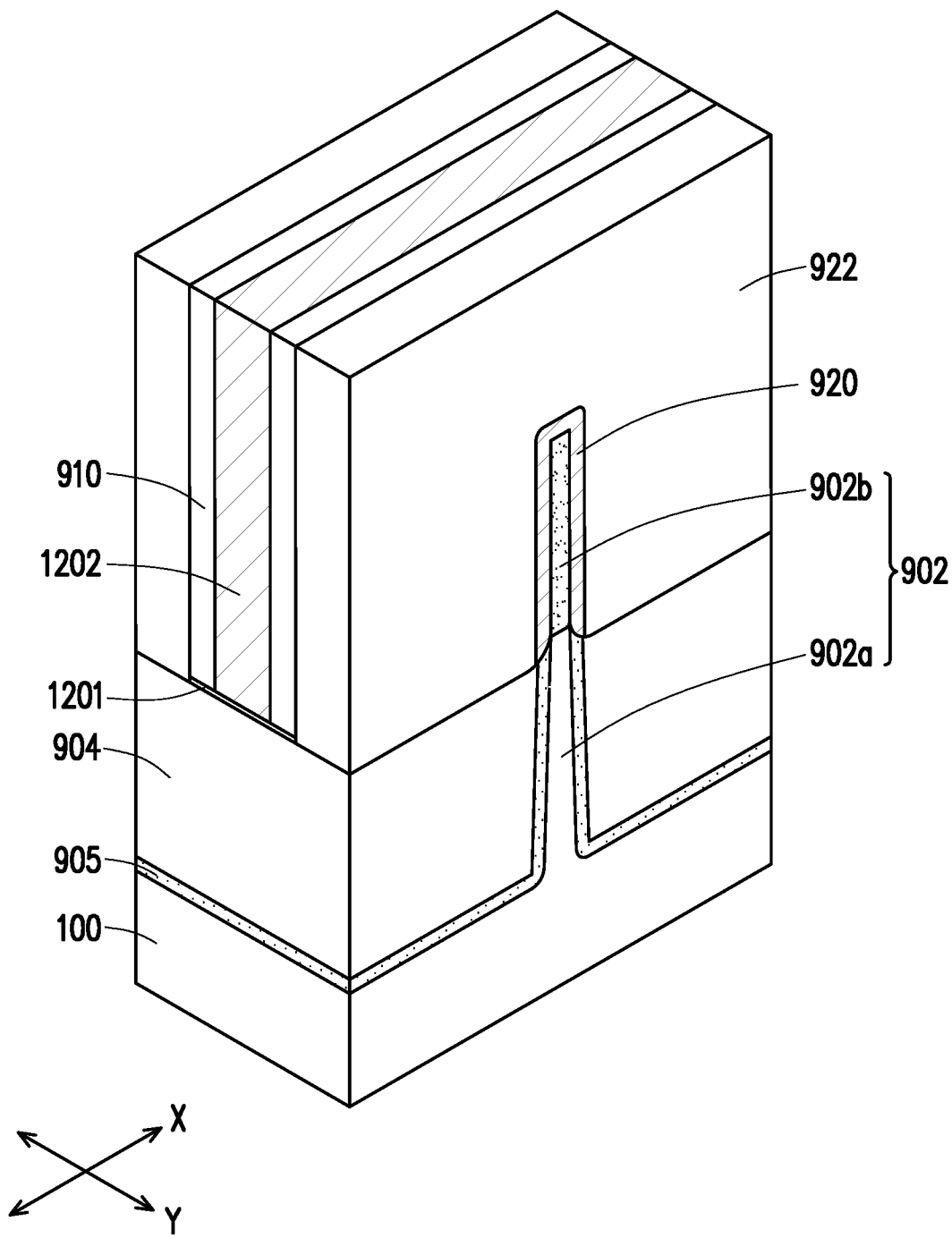

Referring to FIG. 11 and FIG. 12G, step S1112 is performed, and the dielectric layer 922 is formed on the source/drain structures 920 and portions of the isolation structure 904 outside the initial sidewall spacers 1206. In some embodiments, a method for forming the dielectric layer 922 includes forming a dielectric material layer globally covering the structure as shown in FIG. 12F. Subsequently, a planarization process is performed for removing an upper part of the dielectric material layer, and the remained portions of the dielectric material layer form the dielectric layer 922. During the planarization process, the hard mask 1204 and portions of the initial sidewall spacers 1206 covering the opposite sidewalls of the hard mask 1204 may be removed along with the upper part of the dielectric material layer. Accordingly, the initial gate electrode 1202 is currently exposed, and the initial sidewall spacers 1206 are shortened to form the sidewall spacers 910 as described with reference to FIG. 9. In some embodiments, a top surface of the dielectric layer 922 may be substantially coplanar with top surfaces of the initial gate electrode 1202 and the sidewall spacers 910.

Figure 12H:
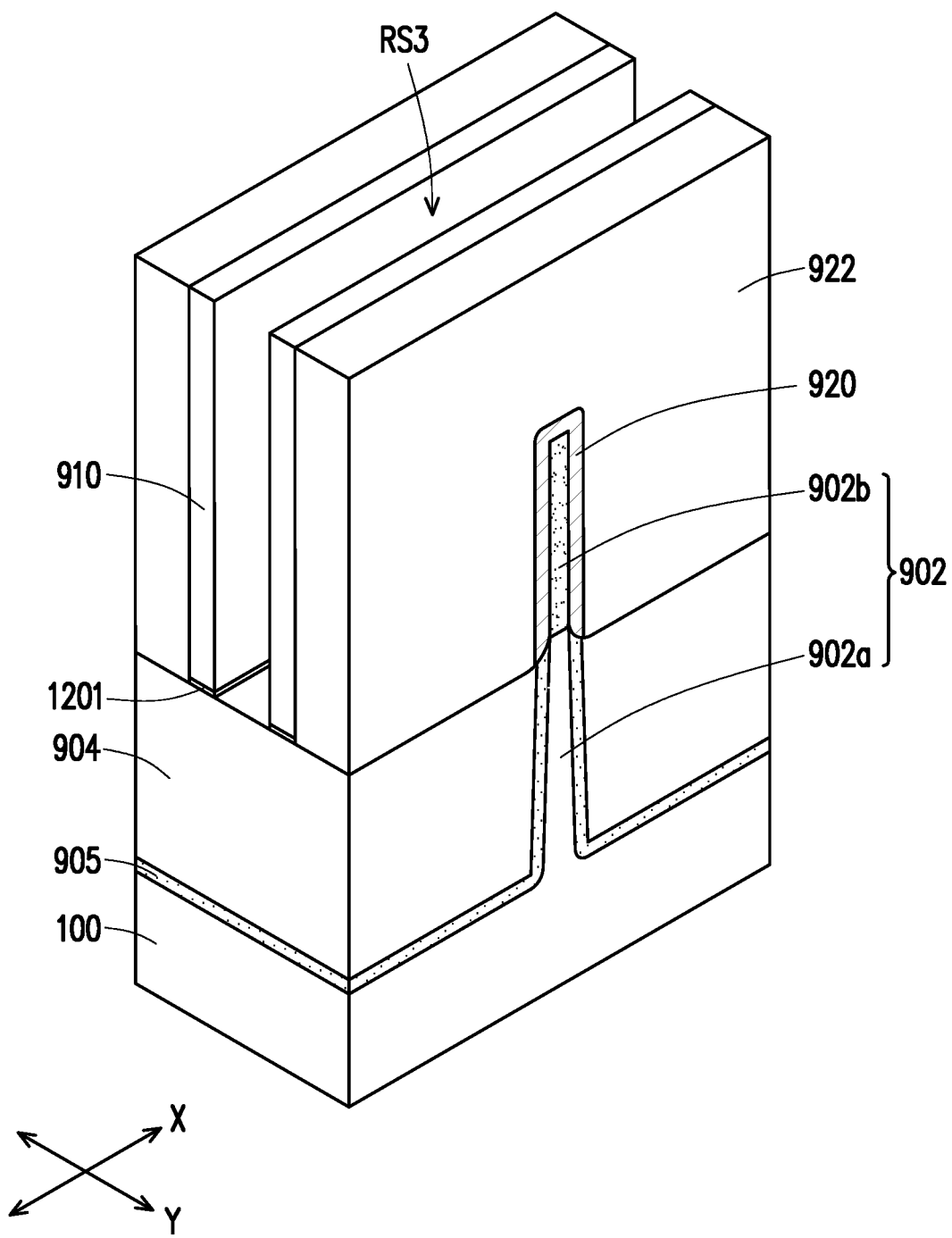

Referring to FIG. 11 and FIG. 12H, step S1114 is performed, and the initial gate electrode 1202 is removed. An etching process may be used for removing the initial gate electrode 1202. Further, during the etching process, a portion of the capping layer 1201 previously covered by the initial gate electrode 1202 may be removed along with the initial gate electrode 1202. Accordingly, a recess RS3 is defined between the sidewall spacers 910, and a portion of the fin structure 902 located between the sidewall spacers 910 is currently exposed in the recess RS3.

Figure 12I:
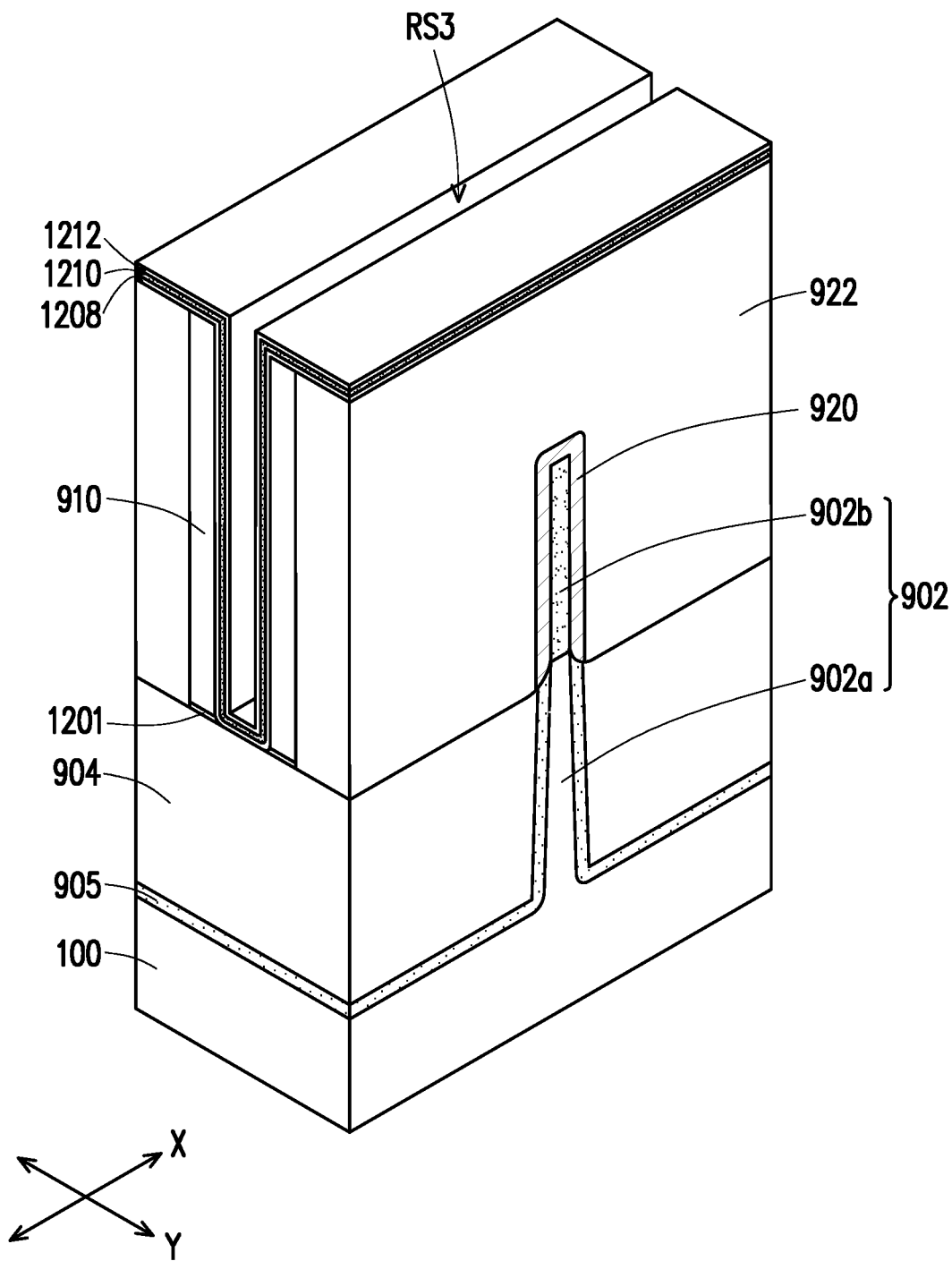

Referring to FIG. 11 and FIG. 12I, step S1116 is performed, and initial insulating layers 1208, 1210, 1212 are conformally formed on the structure as shown in FIG. 12H. The initial insulating layers 1208, 1210, 1212 will be patterned to form the tunneling layer 914, the charge trapping layer 916 and the gate dielectric layer 918 (as described with reference to FIG. 9), respectively. Currently, the initial insulating layers 1208, 1210, 1212 conformally cover surfaces of the recess RS3, and may further extend onto top surfaces of the sidewall spacers 910 and the dielectric layer 922. In other words, inner sidewalls and the top surfaces of the sidewall spacers 910, a top surface of a portion of the isolation structure 904 located between the sidewall spacers 910, exposed surfaces of the fin structure 902 and the top surface of the dielectric layer 922 are covered by the initial insulating layers 1208, 1210, 1212.

Figure 12J:
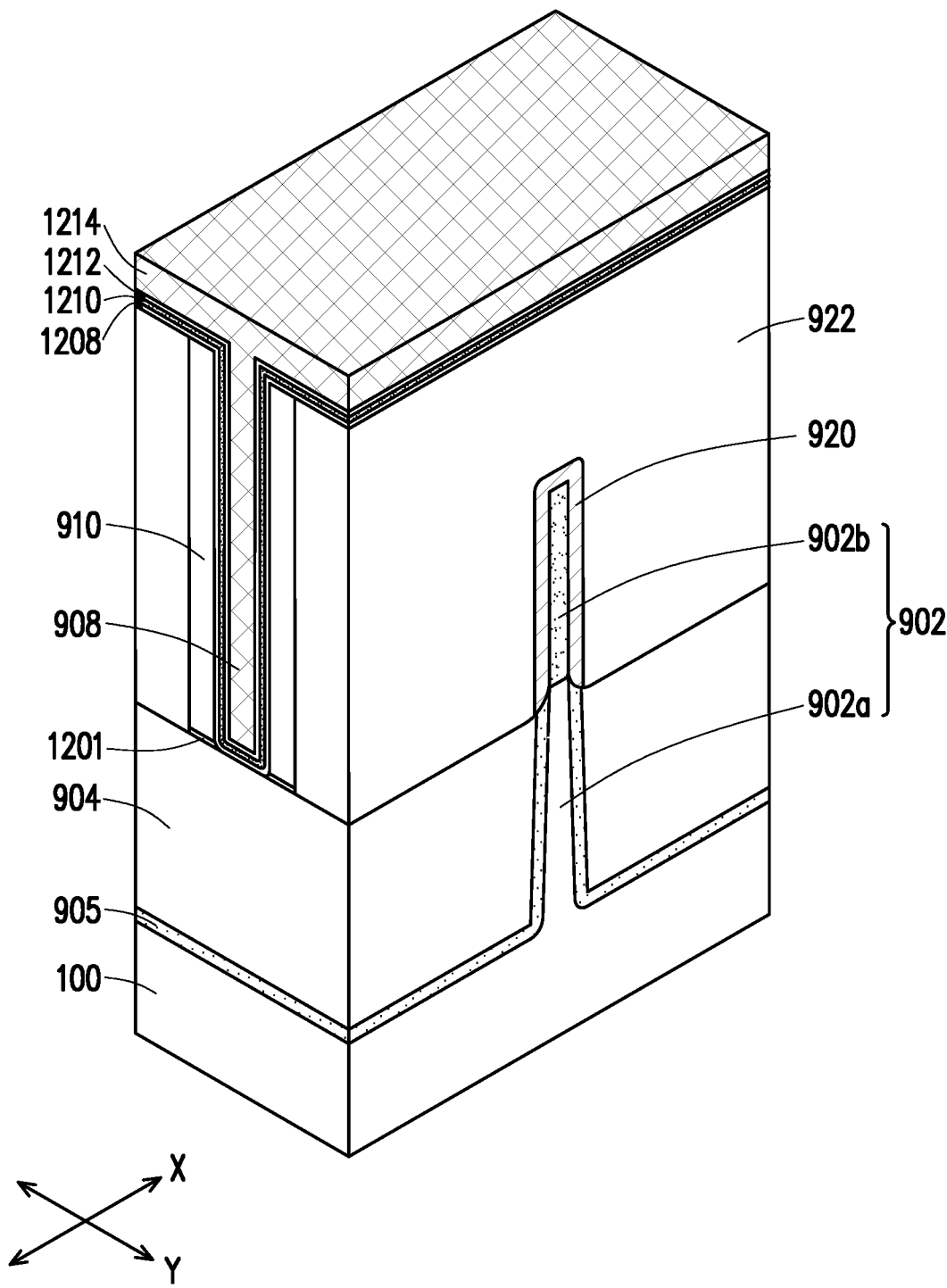

Referring to FIG. 11 and FIG. 12J, step S1118 is performed, and a gate material 1214 is formed in the recess RS3 and above the sidewall spacers 910 and the dielectric layer 922. The gate material 1214 will be patterned to form the gate electrode 908. Currently, the gate material 1214 may be formed to a height over the sidewall spacers 910 and the dielectric layer 922. Therefore, the recess RS3 is filled up by the gate material 1214.

Referring to FIG. 11 and FIG. 9, step S1120 is performed, and the initial insulating layers 1208, 1210, 1212 as well as the gate material 1214 are patterned. As described above, the initial insulating layers 1208, 1210, 1212 are patterned to form the tunneling layer 914, the charge trapping layer 916 and the gate dielectric layer 918, respectively. In addition, the gate material 1214 is patterned to form the gate electrode 908. In some embodiments, a method for patterning the initial insulating layers 1208, 1210, 1212 and the gate material 1214 includes performing a planarization process for removing portions of the initial insulating layers 1208, 1210, 1212 and the gate material 1214 over the top surfaces of the sidewall spacers 910 and the dielectric layer 922. In these embodiments, remained portions of the initial insulating layers 1208, 1210, 1212 and the gate material 1214 are located in the recess RS3, and form the tunneling layer 914, the charge trapping layer 916, the gate dielectric layer 918 and the gate electrode 908, respectively. For instance, the planarization process may include a polishing process, an etching process or a combination thereof.

Up to here, the fin-type flash transistor 900 has been formed, according to some embodiments of the present disclosure. In addition, back-end-of-line (BEOL) process may be further performed for routing the fin-type transistors 900 functioned as the selection transistors SG (as shown in FIG. 1A) to the bit lines BL (also shown in FIG. 1A). In alternative embodiments, the initial gate electrode 1202 would not be replaced by the gate electrode 908, and initial insulating layers (not shown) for forming insulating layers functioned as similar to the tunneling layer 914, the charge trapping layer 916 and the gate dielectric layer 918 may be formed on the structure as shown in FIG. 12C before formation of the initial gate electrode 1202. In these alternative embodiments, the initial gate electrode 1202 is functioned as a gate terminal of the formed fin-type transistor, and portions of these initial insulating layers outside the sidewall spacers 910 may be removed during formation of the sidewall spacers 910, while remained portions of these initial insulating layers form the layers functioned as similar to the tunneling layer 914, the charge trapping layer 916 and the gate dielectric layer 918. Furthermore, in some other embodiments, the fin structure 902 is entirely a portion of the substrate, and the steps of forming the epitaxial structure 1200 as described with reference to FIG. 11 and FIG. 12A may be omitted.

Figure 13:
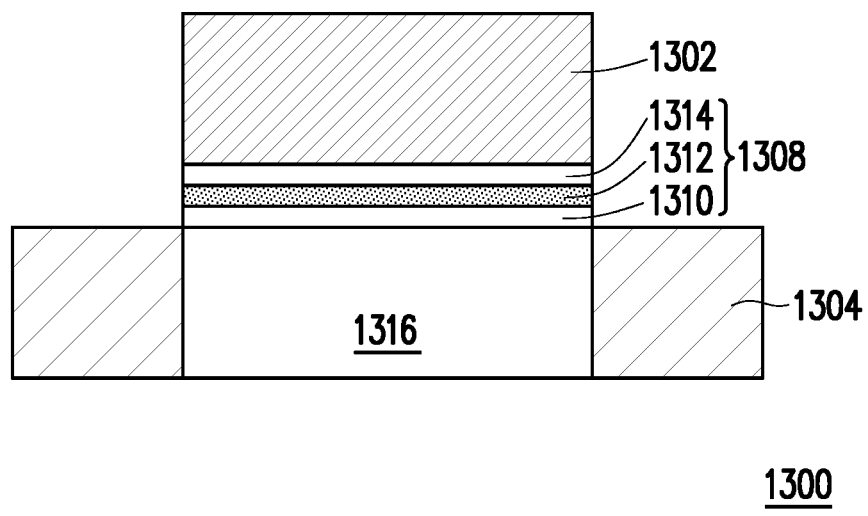
FIG. 13 is a schematic cross-sectional view illustrating an alternative configuration of the transistor of each memory cell and/or each selection transistor, according to some embodiments of the present disclosure.

FIG. 13 is a schematic cross-sectional view illustrating an alternative configuration of the transistor of each memory cell MC and/or each selection transistor SG, according to some embodiments of the present disclosure.

Referring to FIG. 13, in some embodiments, each memory cell MC and/or each selection transistor SG is formed of a tunneling transistor 1300. As similar to the planar-type flash transistor as described with reference to FIG. 1B and the fin-type flash transistor 900 as described with reference to FIG. 9, the tunneling transistor 1300 includes a gate structure 1302 and a pair of source/drain structures 1304 at opposite sides of the gate structure 1302, and the gate structure 1302 includes a gate electrode 1306 and insulating layers 1308 lying below the gate electrode 1304. The insulating layers 1308 may include a tunneling layer 1310, a charge trapping layer 1312 and a gate dielectric layer 1314. It should be noted that, the above-described elements of the tunneling transistor 1300 are schematically depicted, and may be formed in shapes similar to the elements in the planar-type flash transistor as described with reference to FIG. 1B, or in shapes similar to the elements in the fin-type flash transistor 900 as described with reference to FIG. 9. The tunneling transistor 1300 is different from the planar-type flash transistor and the fin-type flash transistor 900 mainly in that the source/drain structures 1304 are doped with complementary (opposite) conductive types, while a channel region 1316 (may be a portion of a substrate or an epitaxial structure) lying below the gate structure 1302 and between the source/drain structures 1304 may be intrinsic. For instance, one of the source/drain structures 1304 may be doped with P-type, while the other of the source/drain structures 1304 may be doped with N-type. Accordingly, the source/drain structures 1304 and the channel region 1316 in between form a P-I-N junction. Due to the P-I-N junction, BTB tunneling occurs at interfaces between the source/drain structures 1304 and the channel region 1316 when the tunneling transistor 1300 is turned on, and a BTB tunneling current flowing through the channel region 1316 from one of the source/drain structures 1304 to the other is generated. On the other hand, the BTB tunneling current is absent when the tunneling transistor 1300 is in an off state. In addition, as a result of such asymmetry doping configuration of the source/drain structures 1304, there may not be multiple sites in the charge trapping layer 1312 for data storage. Instead, there may be a single site in the charge trapping layer 1312 for data storage, which is in a location either close to one of the source/drain structures 1304 or to the other. Furthermore, when the tunneling transistor 1300 is functioned as one of the selection transistors SG, at least the charge trapping layer 1312 may be omitted for preventing accidentally programming the selection transistor SG.

As above, opposite ends of each column of the memory cells in the memory array according to embodiments of the present disclosure are both coupled to one of the bit lines. In addition, BTB tunneling current at the selected memory cell is utilized as read current during a read operation. The BTB tunneling current flows from one of the source/drain structures of the selected memory cell to the substrate, rather than flowing from one of the source/drain structures to the other. In some embodiments, the BTB tunneling current from one of the source/drain structures to the substrate can be affected by charges stored in a programming site of the selected memory cell that is relatively close to this source/drain structure, but may not be affected by charges stored in another programming site of the selected memory cell that is relatively close to the other source/drain structure. In other words, charges stored in multiple programming sites of each memory cell may be respectively sensed. In addition, the source/drain structures may be formed of a material having a bandgap different from a bandgap of a material of the channel region of the memory cell, thus heterojunctions can be formed at the interfaces between the source/drain structures and the channel region. Accordingly, the BTB tunneling current can be increased, and read margin of the memory array can be improved.

In an aspect of the present disclosure, a memory array is provided. The memory array comprises: flash transistors, arranged in columns and rows, wherein the flash transistors in each column are in serial connection with one another; word lines, respectively coupled to gate terminals of a row of the flash transistors; and bit lines, respectively coupled to opposite ends of a column of the flash transistors, wherein the opposite ends of each column of the flash transistors are respectively a source/drain terminal of a boundary one of the flash transistors in each column.

In another aspect of the present disclosure, a memory device is provided. The memory device comprises: transistors, disposed on a substrate and arranged along a direction. Each of the transistors comprises: a gate electrode; a charge trapping layer lying between the gate electrode and the substrate; and source/drain structures at opposite sides of the gate electrode, wherein adjacent transistors share one of the source/drain structures in between the gate electrodes of the adjacent transistors, and a heterojunction is formed at an interface between the substrate and each of the source/drain structures.

In yet another aspect of the present disclosure, a memory device is provided. The memory device comprises: gate electrodes, laterally extending along a first direction and separately arranged along a second direction intersected with the first direction; fin structures, laterally extending along the second direction and respectively intersected with and covered by one of the gate electrodes; charge trapping layers, respectively lining between one of the fin structures and a corresponding one of the gate electrodes; and source/drain structures, alternately arranged along the second direction with the gate electrodes, wherein adjacent ones of the source/drain structures are disposed at opposite sides of one of the gate electrodes, and a heterojunction is formed at an interface between the fin structure and each of the source/drain structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
    flash transistors, arranged in columns and rows, wherein channels of the flash transistors in each column are in serial connection with one another;
    word lines, respectively coupled to gate terminals of a row of the flash transistors; and
    bit lines, respectively coupled to a column of the flash transistors, wherein the serially connected channels of the flash transistors in each column are connected to one of the bit lines by opposite ends.

2. The memory array according to claim 1, wherein a selected one of the flash transistors is configured to be read out by sensing a band-to-band tunneling current flowing from a source/drain terminal of the selected flash transistor to a substrate on which the flash transistors are disposed.

3. The memory array according to claim 2, wherein the band-to-band tunneling current flows between the substrate and one of the bit lines connected to the selected flash transistor.

4. The memory array according to claim 2, wherein a heterojunction forms at an interface between the substrate and each source/drain terminal of each flash transistor.

5. The memory array according to claim 1, further comprising:
    selection transistors, configured to control connection between each bit line and the corresponding column of the flash transistors; and
    selection word lines, respectively coupled to gate terminals of a row of the selection transistors.

6. The memory array according to claim 5, wherein each bit line is connected to the opposite ends of the serially connected channels of the corresponding column of the flash transistors by two of the selection transistors.

7. The memory array according to claim 6, wherein one of the selection transistors connected to a column of the flash transistors including a selected flash transistor is turned on during a read operation, while the other of the selection transistors connected to the column of the flash transistors including the selected flash transistor is configured to be in an off state.

8. The memory array according to claim 1, wherein the flash transistors are N-type flash transistors, and the flash transistors are configured to be programmed by trapping holes in the gate terminals of the flash transistors.

9. The memory array according to claim 1, wherein the flash transistors are P-type flash transistors, and the flash transistors are configured to be programmed by trapping electrons in the gate terminals of the flash transistors.

10. A memory device, comprising:
    transistors, disposed on a substrate and arranged along a direction, wherein each of the transistors comprises:
        a gate electrode;
        a charge trapping layer lying between the gate electrode and the substrate; and
        source/drain structures at opposite sides of the gate electrode, wherein a channel is defined from one the source/drain structures to the other in each transistor, the channels of the transistors are serially connected, and a heterojunction is formed at an interface between the substrate and each of the source/drain structures; and
    a bit line, running over the transistors, and routed to opposite ends of the serially connected channels of the transistors.

11. The memory device according to claim 10, wherein the source/drain structure are formed of a material different from a material of the substrate.

12. The memory device according to claim 10, wherein the source/drain structures and the substrate are formed of the same material, and a concentration of an element in the source/drain structures is higher or lower than a concentration of the element in the substrate.

13. The memory device according to claim 10, wherein the source/drain structures have a first conductive type, and channel regions of the substrate extending between the source/drain structures have a second conductive type complementary to the first conductive type.

14. The memory device according to claim 10, wherein the source/drain structures of each transistor have complementary conductive types, and channel regions of the substrate extending between the source/drain structures are intrinsic.

15. A memory device, comprising:
gate electrodes, laterally extending along a first direction and separately arranged along a second direction intersected with the first direction;
a fin structure, laterally extending along the second direction and intersected with and covered by the gate electrodes;
charge trapping layers, respectively lining between the fin structure and one of the gate electrodes;
source/drain structures, separately disposed on the fin structure, wherein each of the gate electrodes is located between adjacent ones of the source/drain structures, serially connected channels are respectively defined between adjacent ones of the source/drain structures in the fin structure, and a heterojunction is formed at an interface between the fin structure and each of the source/drain structures; and
a bit line, connected to opposite ends of the serially connected channels.

16. The memory device according to claim 15, wherein the fin structures stands on a flat portion of a substrate, a lower portion of the fin structure is a portion of the substrate protruded from the flat portion of the substrate, and an upper portion of the fin structure is an epitaxial structure formed on the substrate.

17. The memory device according to claim 16, wherein the lower and upper portions of the fin structure are formed of different materials.

18. The memory device according to claim 15, wherein each charge trapping layer has two independent data storage sites.

19. The memory device according to claim 18, wherein data stored in each of the data storage sites is programmed or sensed as a result of a band-to-band tunneling current through an adjacent one of the heterojunctions.

20. The memory device according to claim 15, wherein the charge trapping layers respectively cover a bottom surface and a sidewall of one of the gate electrodes.

* * * * *